US006699395B1

(12) United States Patent
Svenkeson et al.

(10) Patent No.: US 6,699,395 B1
(45) Date of Patent: Mar. 2, 2004

(54) METHOD OF FORMING ALIGNMENT FEATURES FOR CONDUCTIVE DEVICES

(75) Inventors: John W. Svenkeson, Marine On St. Croix, MN (US); John D. Hamre, Plymouth, MN (US)

(73) Assignee: Storage Technology Corporation, Louisville, CO (US)

( * ) Notice: Subject to any disclaimer, the term of this patent is extended or adjusted under 35 U.S.C. 154(b) by 286 days.

(21) Appl. No.: 09/690,560

(22) Filed: Oct. 18, 2000

(51) Int. Cl.[7] .................................................. H05K 3/00
(52) U.S. Cl. ............................ 216/13; 216/17; 216/51; 216/52; 216/100; 216/105; 29/847; 219/121.69; 219/121.71
(58) Field of Search ............................. 216/13, 17, 51, 216/52, 100, 105; 148/DIG. 105; 29/847; 219/121.69, 121.71

(56) References Cited

U.S. PATENT DOCUMENTS

| 3,401,369 A | | 9/1968 | Palmateer et al. |
| 3,663,920 A | | 5/1972 | Lapham et al. |
| 3,796,986 A | | 3/1974 | Tamburro |
| 4,513,064 A | | 4/1985 | Marcus |
| 4,631,100 A | * | 12/1986 | Pellegrino .................. 156/150 |
| 4,660,920 A | | 4/1987 | Shibano |
| 4,816,427 A | | 3/1989 | Dennis |
| 4,871,315 A | | 10/1989 | Noschese |
| 4,940,413 A | | 7/1990 | Childers et al. |
| 4,991,290 A | | 2/1991 | MacKay |
| 5,046,954 A | * | 9/1991 | Schmedding ............... 439/593 |
| 5,163,835 A | | 11/1992 | Morlion et al. |
| 5,175,409 A | | 12/1992 | Kent |
| 5,176,524 A | | 1/1993 | Mizuno et al. |
| 5,219,292 A | | 6/1993 | Dickirson et al. |
| 5,252,784 A | | 10/1993 | Asai et al. |
| 5,261,826 A | | 11/1993 | Leeb et al. |
| 5,284,725 A | * | 2/1994 | Takatsu ......................... 430/5 |
| 5,336,095 A | * | 8/1994 | Walburn et al. .............. 439/67 |
| 5,343,616 A | | 9/1994 | Roberts |
| 5,345,364 A | | 9/1994 | Biernath |
| 5,373,109 A | | 12/1994 | Argyrakis et al. |
| 5,383,788 A | | 1/1995 | Spencer |
| 5,418,691 A | | 5/1995 | Tokura |
| 5,442,170 A | | 8/1995 | Kreft et al. |
| 5,451,261 A | * | 9/1995 | Fujii et al. ................... 118/728 |
| 5,521,992 A | | 5/1996 | Chun et al. |

(List continued on next page.)

FOREIGN PATENT DOCUMENTS

| DE | 3932277 A1 | | 4/1990 | |
| JP | 01209794 A | * | 8/1989 | ............ H05K/3/46 |
| JP | 04186731 A | * | 7/1992 | ......... H01L/21/321 |
| WO | WO 99/30542 | * | 6/1999 | |

OTHER PUBLICATIONS

IBM Technical Disclosure Bulletin, NN81034466, "Embedded Reference or Voltage Plane for Metallized Ceramic Substrate" 23 (10), pp 4466–4467, Mar. 1981.*
U.S. patent application Ser. No. 09/690,791, Svenkeson et al., filed Oct. 2000.
U.S. patent application Ser. No. 09/690,561, Svenkeson et al., filed Oct. 2000.
U.S. patent application Ser. No. 09/690,348, Svenkeson et al., filed Oct. 2000.

*Primary Examiner*—Anita Alanko
(74) *Attorney, Agent, or Firm*—Brooks Kushman P.C.

(57) ABSTRACT

A method of forming a conductive device includes forming a conductive layer on a substrate; etching the conductive layer to form a plurality of conductive traces; etching the conductive layer to form at least one mask feature; and removing substrate material that is not covered by the at least one mask feature so as to form at least one mechanical alignment feature.

19 Claims, 14 Drawing Sheets

U.S. PATENT DOCUMENTS

| | | | |
|---|---|---|---|
| 5,582,745 A | * 12/1996 | Hans et al. | 216/18 |
| 5,643,835 A | * 7/1997 | Chia et al. | 29/827 |
| 5,731,047 A | * 3/1998 | Noddin | 216/17 |
| 5,741,148 A | 4/1998 | Biernath | |
| 5,764,497 A | 6/1998 | Mizumo | |
| 5,808,529 A | 9/1998 | Hamre | |
| 5,827,084 A | 10/1998 | Biernath | |
| 5,917,149 A | 6/1999 | Barcley et al. | |
| 5,971,806 A | 10/1999 | Evans et al. | |
| 6,012,221 A | 1/2000 | Campbell | |
| 6,139,360 A | 10/2000 | Hayashi et al. | |
| 6,431,876 B1 | * 8/2002 | Svenkeson et al. | 439/67 |
| 6,438,281 B1 | * 8/2002 | Tsukamoto et al. | 385/14 |
| 6,508,674 B1 | * 1/2003 | Svenkeson et al. | 439/631 |

* cited by examiner

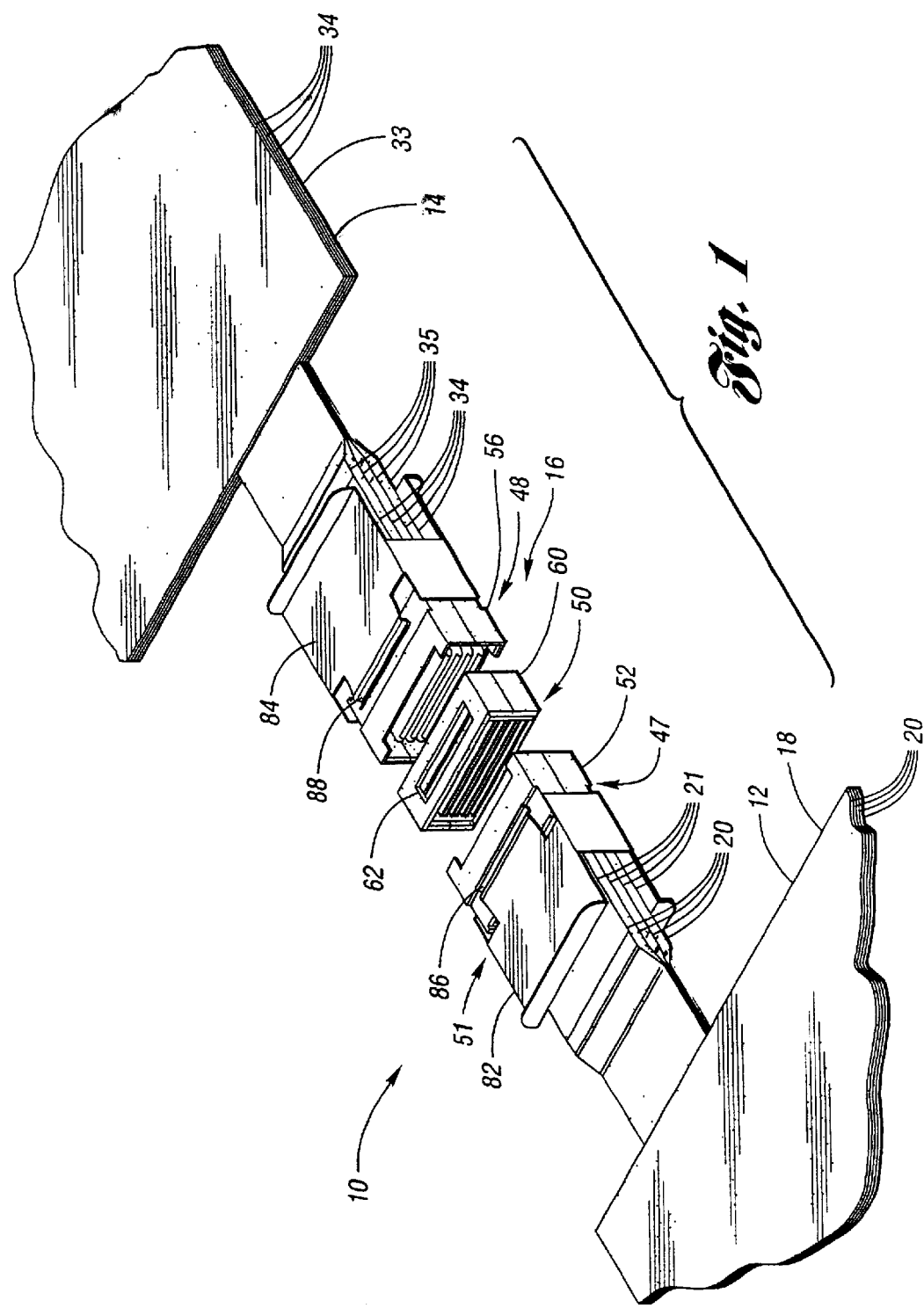

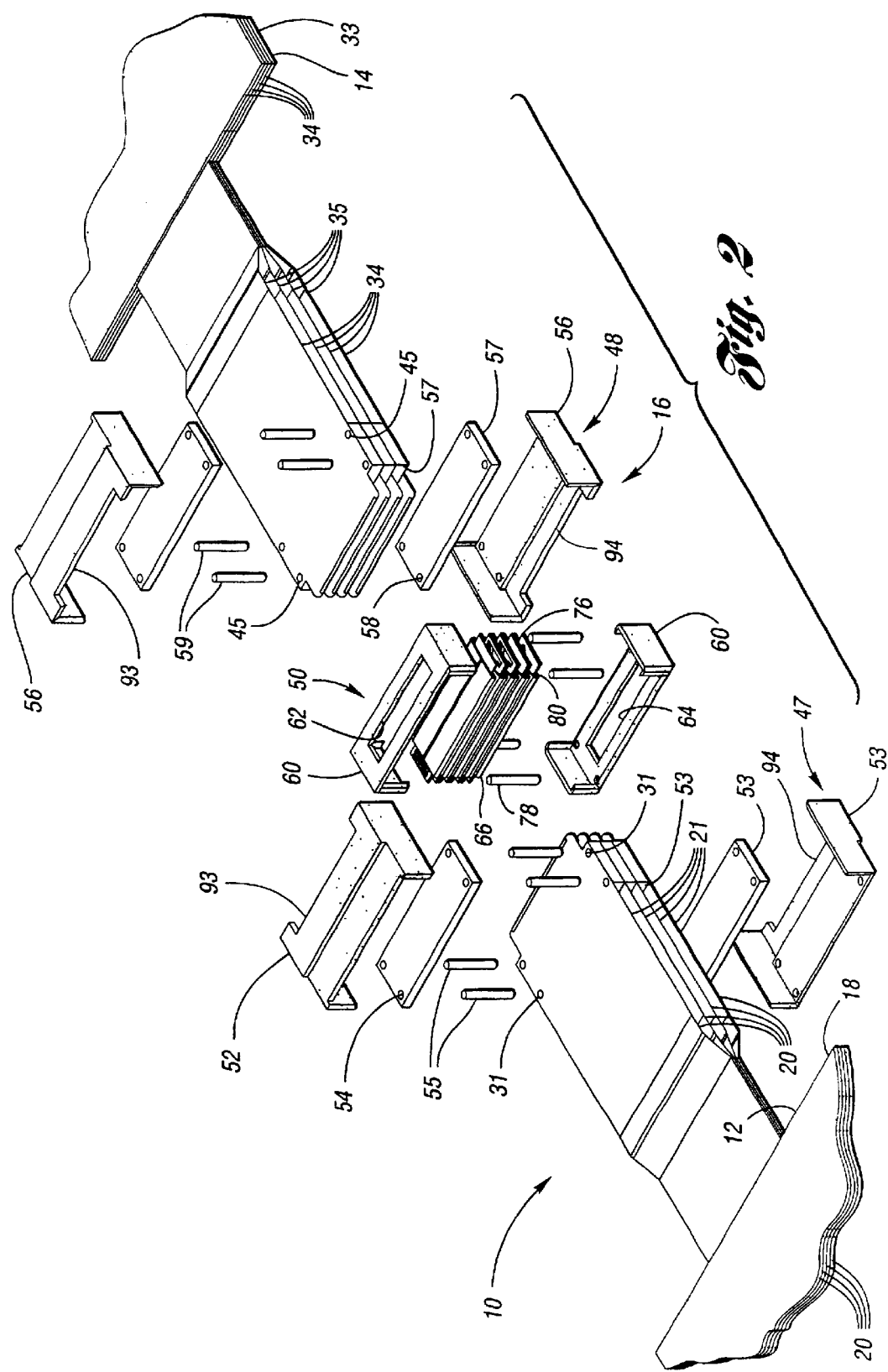

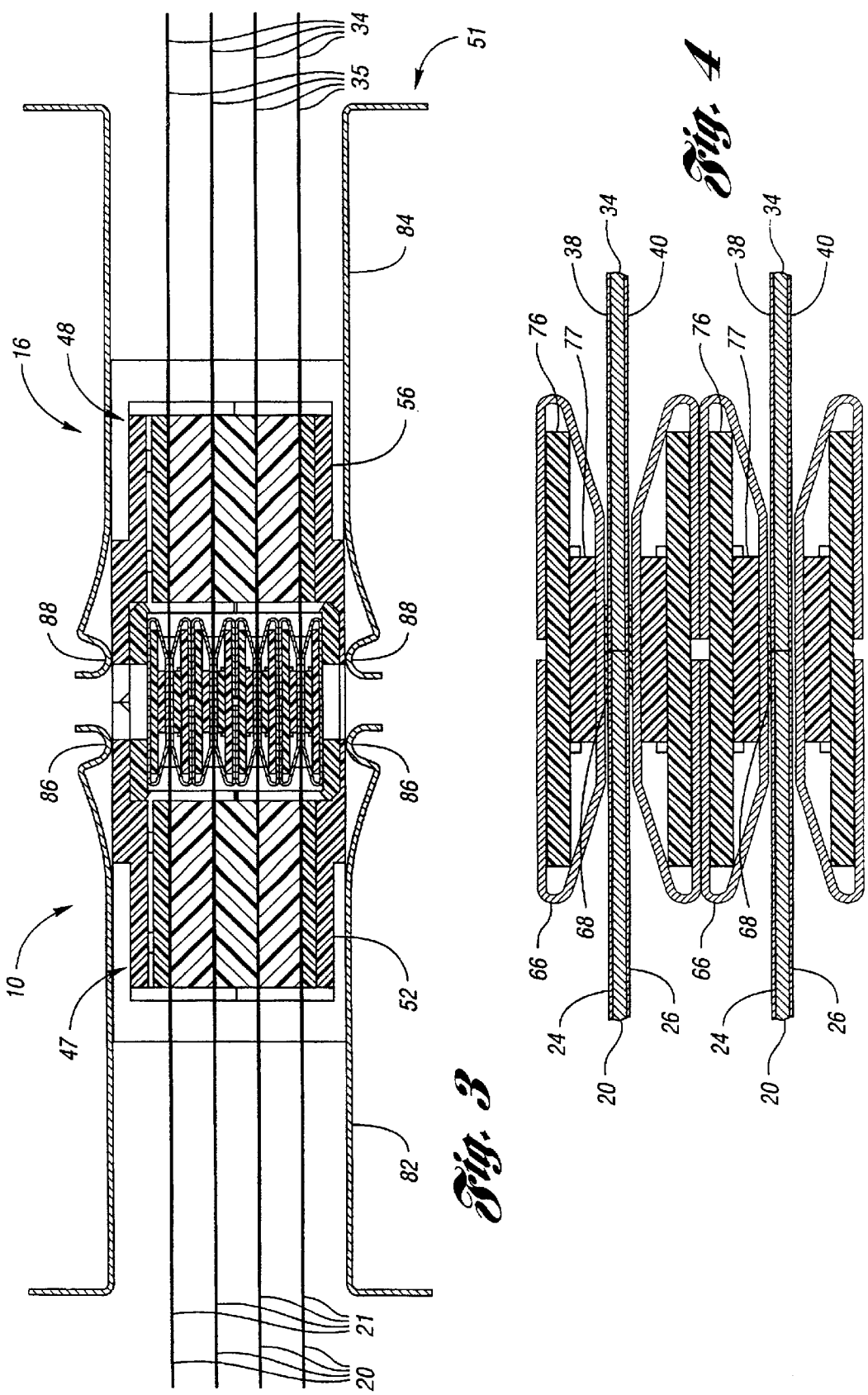

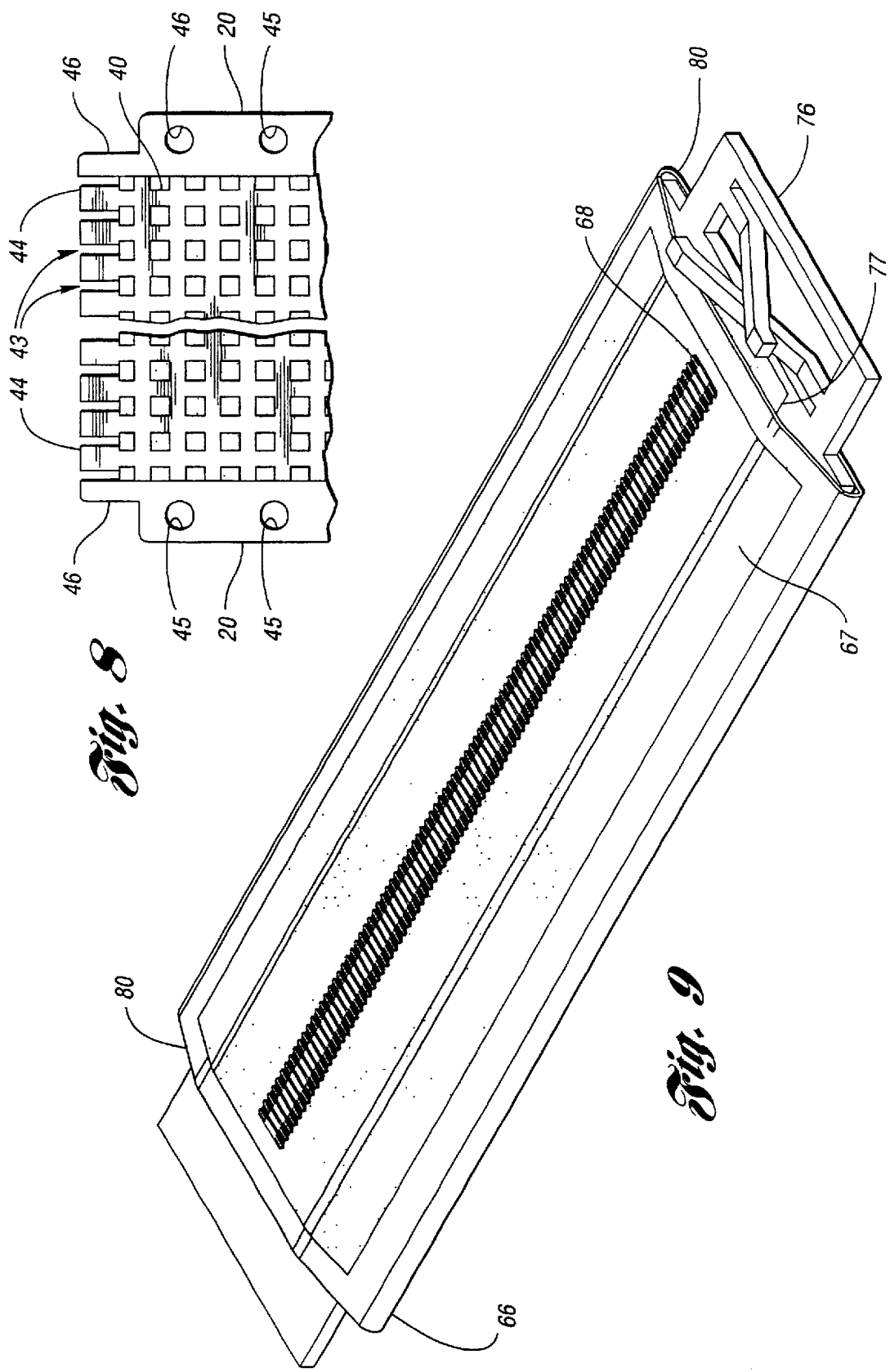

METHOD OF FORMING ALIGNMENT FEATURES FOR CONDUCTIVE DEVICES

TECHNICAL FIELD

The invention relates to an improved method for forming alignment features on conductive devices.

BACKGROUND ART

An important and continuing goal in the computer and electronics industries is that of increasing conductive or signal trace density and bandwidth of conductive devices, such as printed circuit boards (PCB's). A limiting factor for increasing the trace density is the ability to properly align the traces of one PCB with the traces of another PCB when the PCB's are electrically joined together. In order to align the traces of the PCB's, alignment features are typically formed on each PCB.

A prior method of forming a PCB with such alignment features includes forming a plurality of traces on a substrate. The PCB is then inserted into a drilling device, and a drill bit of the drilling device is optically aligned with contact portions of the traces. Next, the drill bit is used to form a plurality of mechanical alignment features such as holes in the board. The holes may then be used to pin the PCB to another PCB having similar holes so as to align the contact portions of the PCB's.

Because the mechanical alignment features are formed separately from the traces, it is difficult to obtain precise registration of the mechanical alignment features with the contact portions of the traces.

DISCLOSURE OF INVENTION

The invention addresses the shortcomings of the prior art by providing an improved method of forming a conductive device having one or more mechanical alignment features that are aligned with conductive traces of the device.

Under the invention, a method of forming a conductive device includes forming a conductive layer on a substrate; etching the conductive layer to form a plurality of conductive traces; etching the conductive layer to form at least one mask feature; and removing substrate material that is not covered by the at least one mask feature so as to form at least one mechanical alignment feature.

Preferably, the forming steps are performed simultaneously by a photo-etching process. As a result, precise registration between the at least one mask feature and the contact portions can be achieved.

Advantageously, the method of the invention may be used to form various configurations of the at least one alignment feature. For example, the at least one alignment feature may be formed as a hole, a side edge, a tab and/or a slot.

More specifically, a method under the invention of forming a printed circuit board includes forming a conductive layer on a substrate; etching the conductive layer to form multiple conductive traces, each trace having a contact portion; etching the conductive layer to form multiple mask features that cooperate to define a template; and ablating with a laser substrate material that is not covered by the template so as to form a plurality of mechanical alignment features.

Theses and other objects, features and advantages of the invention are readily apparent from the following detailed description of the best modes for carrying out the invention when taken in conjunction with the accompanying drawings.

BRIEF DESCRIPTION OF DRAWINGS

FIG. 1 is a perspective view of a first embodiment of a conductive network according to the invention including first and second multi-layer printed circuit boards and a connector assembly, wherein the connector assembly includes first and second plug assemblies and a socket assembly;

FIG. 2 is an exploded perspective view of the plug assemblies and the socket assembly;

FIG. 3 is a side cross-sectional view of the conductive network showing the plug assemblies engaged with the socket assembly;

FIG. 4 is an enlarged fragmentary view of a portion of FIG. 3;

FIG. 8 is a bottom view of the second signal layer of the second printed circuit board;

FIG. 9 is a perspective view of a bridge pad of the socket assembly;

BEST MODES FOR CARRYING OUT THE INVENTION

Figure 5:
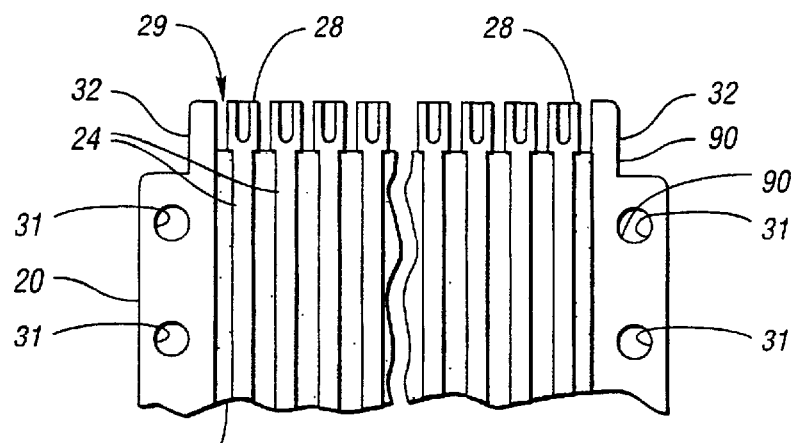
FIG. 5 is a plan view of a first signal layer of the first printed circuit board.

FIGS. 1–4 show a conductive system or network 10 for use in computer and/or electronic equipment, such as data processing equipment and networking equipment. The network 10 includes first and second conductive devices, such as first and second multi-layer printed circuit boards (PCB's) 12 and 14, respectively, and a connector assembly 16 for connecting together the PCB's 12 and 14. The first PCB 12 has a first main body 18 that includes multiple first signal layers 20. A portion 21 of each first signal layer 20 preferably extends beyond the first main body 18 so as to provide access to each first signal layer 20. Furthermore, the portions 21 are preferably flexible and not bonded to each other proximate distal ends of the portions 21, so that the portions 21 are independently moveable.

Figure 6:
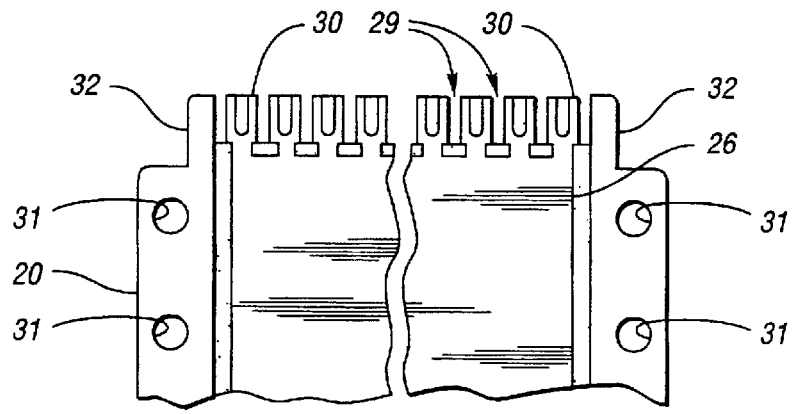
FIG. 6 is a bottom view of the first signal layer of the first printed circuit board.

Referring to FIGS. 5 and 6, each first signal layer 20 has a first substrate 22, a plurality of first conductive paths or traces 24 disposed on one side of the first substrate 22, and a first ground plane 26 disposed on an opposite side of the first substrate 22. While the first substrates 22 may comprise any suitable material such as an insulating polymer, each first substrate 22 preferably comprises HBR Flex™, available from Hadco Corp. of Salem, N.H. Other suitable materials include MYLAR™.

Each first trace 24 includes a first contact portion 28. Preferably, first substrate material is removed between adjacent first contact portions 28 so as to form a plurality of first apertures such as first gaps or notches 29. With such a configuration, each first contact portion 28 may be independently displaced with respect to the other first contact portions 28. Alternatively, first substrate material may be removed between select first contact portions 28, or the first substrate 22 may be left intact.

Each first ground plane 26 may have any suitable configuration such as a solid plane shown in FIG. 6, or a cross-hatched configuration as is known in the art. Each first ground plane 26 also includes a plurality of first ground contact portions 30. Advantageously, the first ground contact portions 30 are also separated by the first notches 29 so that each first ground contact portion 30 may be independently displaced with respect to the other first ground contact portions 30.

Each first signal layer 20 also includes one or more first alignment features, such as first holes 31 and first side edges 32 as shown in FIG. 5. The first alignment features are used to align the first contact portions 28 with respect to other elements, as explained below in greater detail. The first alignment features are preferably formed by a novel process described below, so as to provide precise registration of the first alignment features with respect to the first contact portions 28.

Similar to the first PCB 12, the second PCB 14 has a second main body 33 that includes multiple second signal layers 34 as shown in FIGS. 1 and 2. A portion 35 of each second signal layer 34 preferably extends beyond the second main body 33 so as to provide access to each second signal layer 34. Furthermore, the portions 35 are preferably flexible and not bonded to each other proximate distal ends of the portions 35, as shown in FIG. 2, so that the portions 35 are independently moveable.

Figure 7:
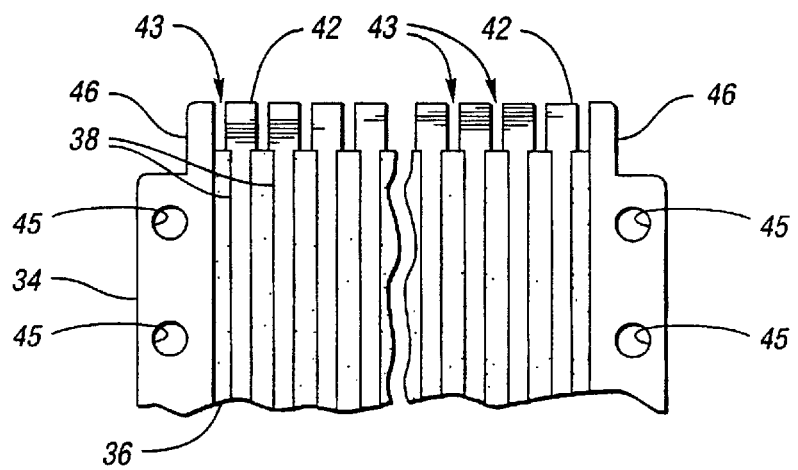
FIG. 7 is a plan view of a second signal layer of the first printed circuit board.

Referring to FIGS. 7 and 8, each second signal layer 34 has a second substrate 36, a plurality of second conductive paths or traces 38 disposed on one side of the second substrate 36, and a second ground plane 40 disposed on an opposite side of the second substrate 36. Each second trace 38 includes a second contact portion 42. Preferably, second substrate material is removed between adjacent second contact portions 42 so as to form a plurality of second apertures such as second gaps or notches 43. With such a configuration, each second contact portion 42 may be independently displaced with respect to the other second contact portions 42. Alternatively, second substrate material may be removed between select second contact portions 42, or the second substrate 36 may be left intact.

Each second ground plane 40 may have any suitable configuration such as a cross-hatched configuration shown in FIG. 8, or a solid plane. Each second ground plane 40 also includes a plurality of second ground contact portions 44. Advantageously, the second ground contact portions 44 are also separated by the second notches 43 so that each second ground contact portion 44 may be independently displaced with respect to the other second ground contact portions 44.

Each second signal layer 34 also includes one or more second alignment features, such as second holes 45 and second side edges 46. The second alignment features are used to align the second contact portions 42 with respect to other elements, as explained below in greater detail. The second alignment features are preferably formed by a novel process described below, so as to provide precise registration of the second alignment features with respect to the second contact portions 42.

Referring to FIGS. 1–3, the connector assembly 16 is used to electrically join together the first and second contact portions 28 and 42, respectively, as well as the first and second ground planes 26 and 40, respectively. The connector assembly 16 includes multiple fixtures that are joinable together. For example, the connector assembly 16 may include first and second spacer assemblies such as first and second plug assemblies 47 and 48, respectively, and a bridging assembly such as a receptacle or socket assembly 50. Alternatively, the spacer assemblies may be configured as socket assemblies, and the bridging assembly may be configured as a plug assembly. The connector assembly 16 further includes a clamping device 51, as shown in FIGS. 1 and 3.

The first plug assembly 47 is connected to the first PCB 12, and includes a first housing 52 that receives the first signal layers 20. The first plug assembly 47 further includes a plurality of first spacers 53, and each first spacer 53 is disposed between adjacent first signal layers 20, or between a first signal layer 20 and the first housing,52, for spacing the first signal layers 20 apart. Each first spacer 53 includes a plurality of first spacer holes 54 that are aligned with the first holes 31 of the first signal layers 20. While the first spacers 53 may comprise any suitable material, the first spacers 53 preferably comprise a non-conductive polymer.

One or more first alignment members, such as first pins 55, extend through the first holes 31 and the first spacer holes 54, so as to align the first signal layers 20 with respect to each other and with respect to the first spacers 53. The first pins 55 also connect the first signal layers 20 to the first housing 52.

Alternatively, in lieu of the first pins 55 and the first spacer holes 54, each first spacer 53 may be provided with a plurality of projections on one side that extend through the first holes 31 of a particular first signal layer 20, and a plurality of recesses on an opposite side for receiving the projections of another first spacer 53. With such a configuration, the first spacers 53 may be snap fit together with each first signal layer 20 being sandwiched between two first spacers 53. The first housing 52 may also be provided with additional projections on one interior surface and additional recesses on another interior surface, so that one first spacer 53 may be snap fit onto the additional projections and another first spacer 53 may be snap fit into the additional recesses.

The second plug assembly 48 is connected to the second PCB 14 and includes a second housing 56 that receives the second signal layers 34. The second plug assembly 48 further includes a plurality of second spacers 57, and each second spacer 57 is disposed between adjacent second signal layers 34, or between a second signal layer 34 and the second housing 56, for spacing the second signal layers 34 apart. Each second spacer 57 includes a plurality of second spacer holes 58 that are aligned with the second holes 45 of the second signal layers 34. While the second spacers 57 may comprise any suitable material, the second spacers 57 preferably comprise a non-conductive polymer.

One or more second alignment members, such as second pins 59, extend through the second holes 45 and the second spacer holes 58, so as to align the second signal layers 34 with respect to each other and with respect to the second spacers 57. The second pins 59 also connect the second signal layers 34 to the second housing 56.

Alternatively, in lieu of the second pins 59 and the second spacer holes 58, each second spacer 57 may be provided with a plurality of projections on one side that extend through the second holes 45 of a particular second signal layer 34, and a plurality of recesses on an opposite side for receiving the projections of another second spacer 57. With such a configuration, the second spacers 57 may be snap fit together with each second signal layer 34 being sandwiched between two second spacers 57. The second housing 56 may also be provided with additional projections on one interior surface and additional recesses on another interior surface, so that one second spacer 57 may be snap fit onto the additional projections and another second spacer 57 may be snap fit into the additional recesses.

Figure 10:
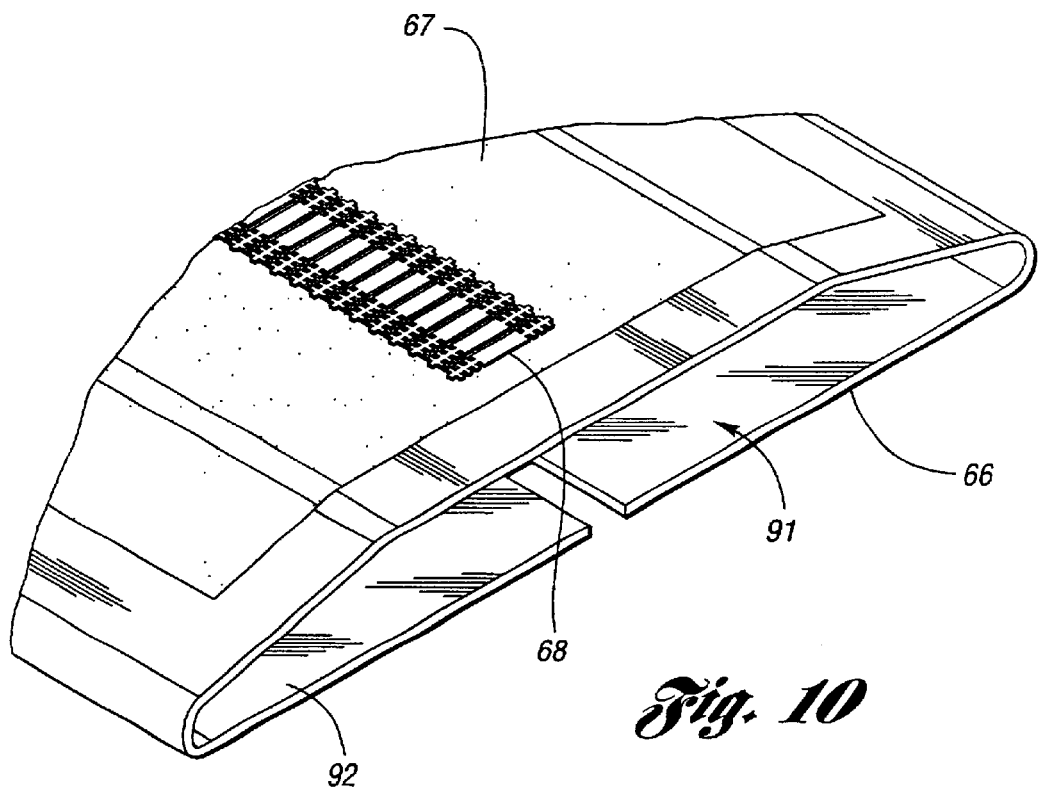
FIG. 10 is a fragmentary perspective view of the bridge pad of FIG. 9.
Figure 11:
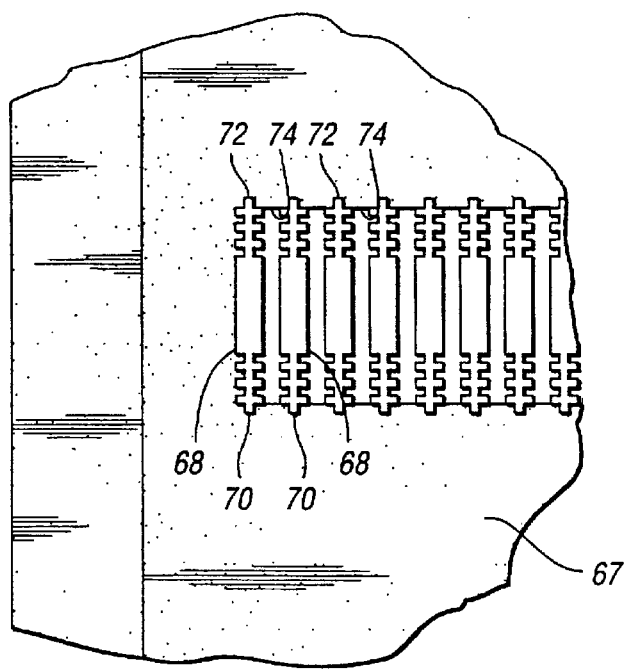
FIG. 11 is a fragmentary plan view of the bridge pad of FIG. 9.

The socket assembly 50 is releasably engageable with the plug assemblies 47 and 48. The socket assembly 50 includes a third housing, such as a socket housing 60, having first and second openings 62 and 64, respectively. A plurality of bridge layers such as bridge pads 66 are disposed in the socket housing 60 for electrically bridging the signal layers 20 and 34. Referring to FIGS. 9–11, each bridge pad 66 includes a bridge substrate 67 and a plurality of bridge traces 68 disposed on one side of the bridge substrate 67. Each bridge trace 68 has first and second bridge contact portions 70 and 72, respectively. Preferably, bridge substrate material is removed between adjacent bridge contact portions 70 and 72 so as to form a plurality of apertures 74. With such a configuration, each bridge contact portion 70 and 72 may be independently displaced with respect to the other bridge contact portions 70 and 72.

Each bridge contact portion 70 and 72 may have any suitable configuration, such as a U-shaped configuration or a rectangular configuration. In the embodiment shown in FIGS. 9–11, each bridge contact portion 70 and 72 has a fish-bone configuration that includes a longitudinally extending main section and a plurality of laterally extending projections extending from the main section. Preferably, each aperture 74 extends between the laterally extending projections of a particular bridge contact portion 70 and 72, so that each laterally extending projection may also be independently displaced.

Referring to FIGS. 2 and 9, the socket assembly 50 further includes a plurality of separators 76, a plurality of fill pads 77, and one or more alignment members such as rollers 78. The separators 76 cooperate with the bridge pads 66 to separate select bridge pads 66 from each other so as to receive select signal layers 20 and 34 therebetween. The fill pads 77 preferably comprise an elastomer or other suitable material, and function to concentrate clamping forces on the contact portions 28, 30, 42, 44, 70 and 72, as explained below in greater detail. The third spacers 77 also allow for the independent displacement of the contact portions 28, 30, 42, 44, 70 and 72. The rollers 78 are engageable with side edges 80 of each bridge pad 66 so as to properly align the bridge pads 66 within the socket housing 60.

Alternatively, the socket assembly 50 may be provided with bridge layers that each include a bridge substrate and a plurality of bridge traces disposed on opposite sides of the bridge substrate. With such a configuration, a single bridge layer could be used to electrically join together two pairs of mating signal layers. For example, such a bridge layer could be used to electrically join first signal traces 24 of each of two first signal layers 20 with second signal traces 38 of each of two second signal layers 34.

Referring to FIGS. 1, 3 and 4, the clamping device 51 cooperates with the socket assembly 50 to force together the bridge pads 66 and the signal layers 20 and 34 such that a first group of bridge pads 66 electrically joins the first and second traces 24 and 38, respectively, and a second group of bridge pads 66 electrically joins the first and second ground planes 26 and 40, respectively. The clamping device 51 includes first and second clamp sections 82 and 84, respectively, that are attached to the first and second housings 53 and 56, respectively, such that the first and second clamp sections 82 and 84, respectively, can move with respect to the first and second housings 53 and 56, respectively. The first clamp section 82 has a pair of engaging portions 86 that are engageable with a pair of engaging portions 88 of the second clamp section 84 so as to exert a clamping force on the bridge pads 66 and signal layers 20 and 34, through the openings 62 and 64. Alternatively, the clamping device 52 may have any suitable configuration for exerting a sufficient clamping force on the bridge pads 66 and signal layers 20 and 34.

A method according to the invention for manufacturing the PCB's 12 and 14, and for assembling the conductive network 10 will now be described. Because the PCB's 12 and 14 may be made in a similar manner, this detailed description will focus primarily on the method of making the first PCB 12. However, a thorough understanding of the method of making the second PCB 14 will be apparent therefrom. Each first signal layer 20 of the first PCB 12 is preferably made by a photo-etching process followed by on ablation process, as explained below in detail.

Referring to FIGS. 5 and 6, conductive films or foils, such as copper foils or copper-alloy foils, are first applied to both sides of a particular first substrate 22, as is known in the art. Next, a substance that hardens when exposed to ultraviolet light, such as dry film resist, is preferably applied over the foils. A pattern, commonly referred to as artwork, is then placed over the dry film resist on each side of the substrate 22. Each pattern covers portions of a particular foil that are to be removed such as through chemical etching. In accordance with an aspect of the invention, the pattern placed on one side of the first substrate 22 preferably defines the outlines or outer boundaries of the first traces 24, as well as outer boundaries of first guide features or first mask features 90 to be used in forming the first alignment features, such as the first holes 31 and fist side edges 32. The pattern placed on the opposite side of the first substrate 22 defines the outline of the first ground plane 26, including the first ground contact portions 30.

Next, sections of the dry film resist not covered by the patterns are exposed to ultraviolet light so as to harden such sections. Non-hardened sections of the dry film resist are then removed through a chemical process known as developing. Next, portions of the foils not covered by hardened dry film resist are removed, such as by chemical etching, so as to define the first traces 24 and first mask features 90 on the one side of the first substrate 22, and to define the ground plane 26 on the opposite side of the first substrate 22.

The first mask features 90 cooperate to define a cutting template that defines outer boundaries of the first alignment features. Next, a soft laser, i.e., a laser that will not remove or ablate the foils, is used to ablate first substrate material that is not in the shadow of or otherwise covered by the template so as to define the first alignment features. The beam of the laser is preferably positioned normal to the first substrate 22 so that the template may be used to accurately define the first alignment features. Alternatively, first substrate material may be removed by plasma ablation or any other suitable ablation process.

Because the first mask features 90 are formed simultaneously with the first traces 24, the method of the invention provides precise registration of the first alignment features with the first traces 24. For example, tolerances of ±0.025 millimeters (mm) may be achieved between each first hole 31 and each first contact portion 28. Advantageously, with such a process, tolerances between the first contact portions 28 and the first alignment features is reduced to tolerances achievable through the photo-etching process.

Alternatively or supplementally, first alignment features may be formed in the same manner for the first ground contact portions 30 of the first ground plane 26. With this arrangement, first mask features would need to be formed on the same side of the first substrate 22 as the first ground contact portions 30, so as to provide precise registration of such first mask features with the first ground contact portions 30.

The laser, or other suitable device, is also preferably used to remove first substrate material disposed between the first contact portions 28, so as to form the first notches 29. During this process, the first contact portions 28 function as mask features or templates for the first notches 29.

After a plurality of first signal layers 20 have been formed, the first signal layers 20 may be bonded together and cut to a desired size and shape so as to form the first PCB 12 having the first main body 18 and portions 21 that extend from the first main body 18. As previously mentioned, however, the portions 21 are preferably not bonded to each other proximate distal ends of the portions 21. Alternatively, the first signal layers 20 may be cut or otherwise shaped prior to bonding the first signal layers 20 together.

Returning to FIGS. 1 and 2, the portions 21 of the first PCB 12 are then positioned between top and bottom pieces of the first housing 52 of the first plug assembly 47, along with the first spacers 53. The first pins 55 are then inserted through the first holes 31 and the first spacer holes 54, and engaged with the first housing 52, so as to properly align the first signal layers 20 within the first housing 52. The two pieces of the first housing 52 are then preferably snap fit together. Alternatively, the pieces of the first housing 52 may be connected together in any suitable manner such as with one or more fasteners or an adhesive.

As explained above, the second PCB 14 may be manufactured in a similar manner as the first PCB 12. The second PCB 14 may also be connected to the second plug assembly 48 in a similar manner as described above with respect to the first PCB 12 and the first plug assembly 47.

The bridge pads 66 of the socket assembly 50 are also preferably manufactured in a similar manner as the first signal layers 20 of the first PCB 12. More specifically, referring to FIGS. 9–11, the bridge traces 68 may be formed on one side of each bridge substrate 67 by the photo-etching process described above in detail. Similarly, guide features or mask features for forming the side edges 80 may also be formed by the photo-etching process. Bridge substrate material is then preferably removed from each bridge substrate 67 by laser ablation, or other suitable ablation process, so as to form the apertures 74 and to define the side edges 80, which function as alignment features for the bridge layers 66.

Each bridge pad 66 is then shaped or otherwise formed, such as by folding, to achieve a desired configuration. Each bridge pad 66 is preferably formed so as to have a cavity 91 for receiving a separator 76 and a fill pad 77. Furthermore, each bridge pad 66 may be formed around a separator 76 and a fill pad 77, or a separator 76 and a fill pad 77 may be inserted into each bridge pad 66 after each bridge pad 66 has been formed into the desired configuration.

While each separator 76 may be any suitable device that is able to be compressed together under sufficient pressure, each separator 76 is preferably a stamped metal spring or other suitable spring. Each bridge pad 66 may also be provided with a conductive foil 92, or other suitable layer, on the side of the corresponding bridge substrate 67 opposite the bridge traces 68. Such a foil assists in maintaining the desired configuration of the bridge pad 66.

Returning to FIGS. 1 and 2, the bridge pads 66 are then positioned between top and bottom pieces of the socket housing 60 so that the bridge traces 68 of adjacent bridge pads 66 face each other. The rollers 78 are then engaged with the side edges 80 of the bridge pads 66 so as to align the bridge pads within the housing 60. The two pieces of the socket housing 60 are then preferably snap fit together. Alternatively, the pieces of the socket housing 60 may be connected together in any suitable manner such as with one or more fasteners or an adhesive. The socket housing 60 may then be mounted in a panel or other member that supports the socket assembly 50.

Referring to FIGS. 1, 3 and 4, the first and second plug assemblies 47 and 48 may then be inserted into or otherwise engaged with the socket assembly 50, such that first and second openings 93 and 94, respectively, of each plug assembly 47 and 48 are respectively aligned with the first and second openings 62 and 64, respectively, of the socket assembly 50. Next, the first and second clamp portions 82 and 84 may be slid or otherwise moved toward each other, until the engaging portions 86 and 88 are engaged with each other, so as to apply the clamping force on the bridge pads 66 and signal layers 20 and 34. Advantageously, the assemblies 47, 48 and 50 allow for blind joining of the PCB's 12 and 14 if, for example, the socket assembly 50 is mounted in a panel or other support member.

The fill pads 77 function to concentrate the clamping force at the contact portions 28, 30, 42, 44, 70 and 72, thereby improving the connection between the PCB's 12 and 14. Advantageously, because the fill pads 77 preferably comprise an elastomer or other suitable flexible material, the fill pads 77 are able to conform to surface variations, or non-coplanarity, of the signal layers 20 and 34 and bridge pads 66 so as to maintain an even distribution of the clamping force over the contact portions 28, 30, 42, 44, 70 and 72.

Moreover, because each contact portion 28, 30, 42, 44, 70 and 72 is preferably independently moveable, the conductive network 10 is able to overcome any non-coplanarity of the signal layers 20 and 34, as well as any non-coplanarity of the bridge pads 66 proximate the bridge traces 68. More specifically, each contact portion 28, 30, 42, 44, 70 and 72 may be independently displaced so as to provide maximum contact with a respective mating contact portion 28, 30, 42, 44, 70 and 72. As a result, the conductive network 10 provides optimum electrical joining of the PCB's 12 and 14.

While the figures show that substrate material is preferably removed between each contact portion 28, 30, 42, 44, 70 and 72, substrate material may be removed between select contact portions 28, 30, 42, 44, 70 and 72. For example, substrate material may be removed between groups of two contact portions 28 or groups of three contact portions 28.

Advantageously, each contact portion 28, 30, 42, 44, 70 and 72 can be formed with a configuration that is sufficiently fine, in terms of contact portion width and sharpness of contact portion edges, so as to create localized areas of relatively high stress concentration when the contact portions 28, 30, 42 and 44 are aligned and forced together with mating contact portions 70 and 72. These areas of high stress concentration deform the contact portions 28, 30, 42, 44, 70 and 72 so as to create reliable connections between mating contact portions 28, 30, 42, 44, 70 and 72, while minimizing clamping forces required to make such connections. Preferably, each contact portion 28, 30, 42, 44, 70 and 72 is formed with a width in the range of 1 to 2 mm, or less. Furthermore, the edges of the contact portions 28, 30, 42, 44, 70 and 72 are preferably formed with a radius less than 0.1mm.

Figure 12:
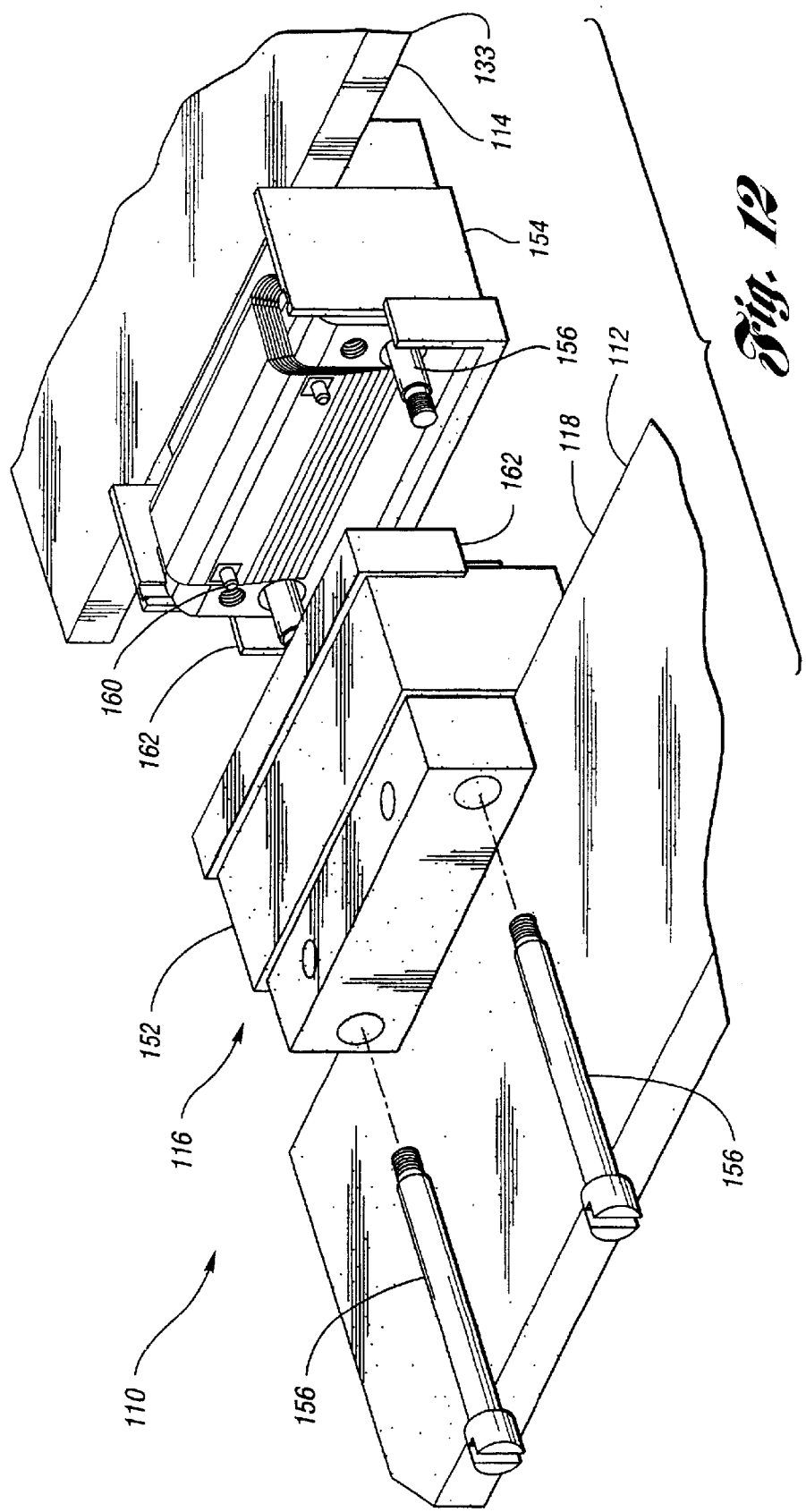
FIG. 12 is a perspective view of a second embodiment of the conductive network according to the invention including first and second multi-layer printed circuit boards and a connector assembly, wherein the connector assembly includes first and second fixtures and a plurality of fasteners.
Figure 13:
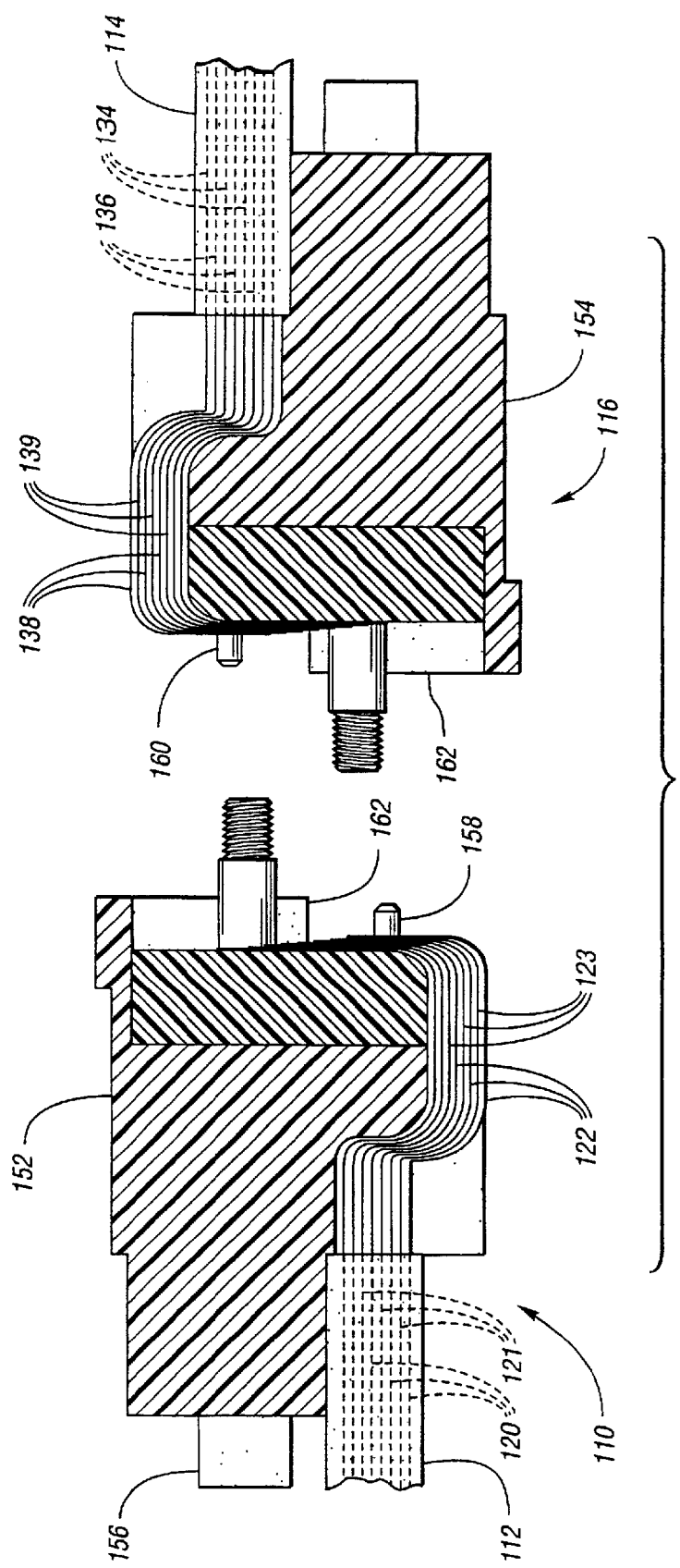
FIG. 13 is a cross-sectional view of the second embodiment of the conductive network with the first and second fixtures spaced away from each other.
Figure 14:
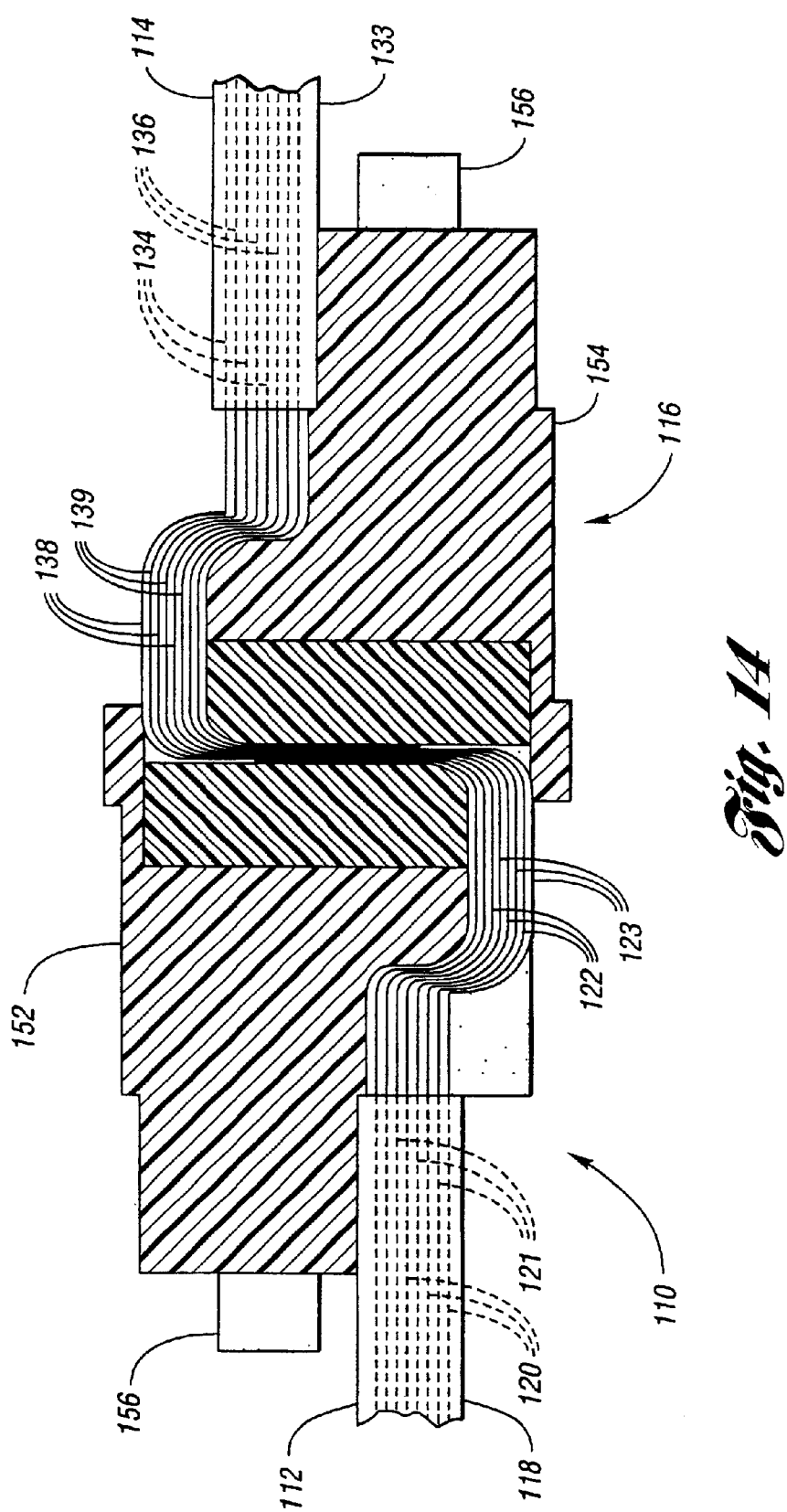
FIG. 14 is a cross-sectional view of the second embodiment of the conductive network with the first and second fixtures engaged with each other.

FIGS. 12–14 show a second embodiment 110 of the conductive network that includes first and second conductive devices, such as first and second multi-layer PCB's 112 and 114, respectively, and a connector assembly 116 for connecting together the PCB's 112 and 114. The first PCB 112 has a first main body 118 that includes multiple first signal layers 120 that alternate with first bridge layers 121. A portion 122 of each first signal layer 120 and a portion 123 of each first bridge layer 121 preferably extend beyond the first main body 118 so as to provide access to the first signal layers 120 and first bridge layers 121. The portions 122 and 123 are also preferably flexible and not bonded to each other proximate distal ends of the portions 122 and 123, so that the portions 122 and 123 are independently moveable. Furthermore, the portions 122 and 123 preferably cooperate to define a first staggered step configuration as shown in FIG. 13.

Figure 15:
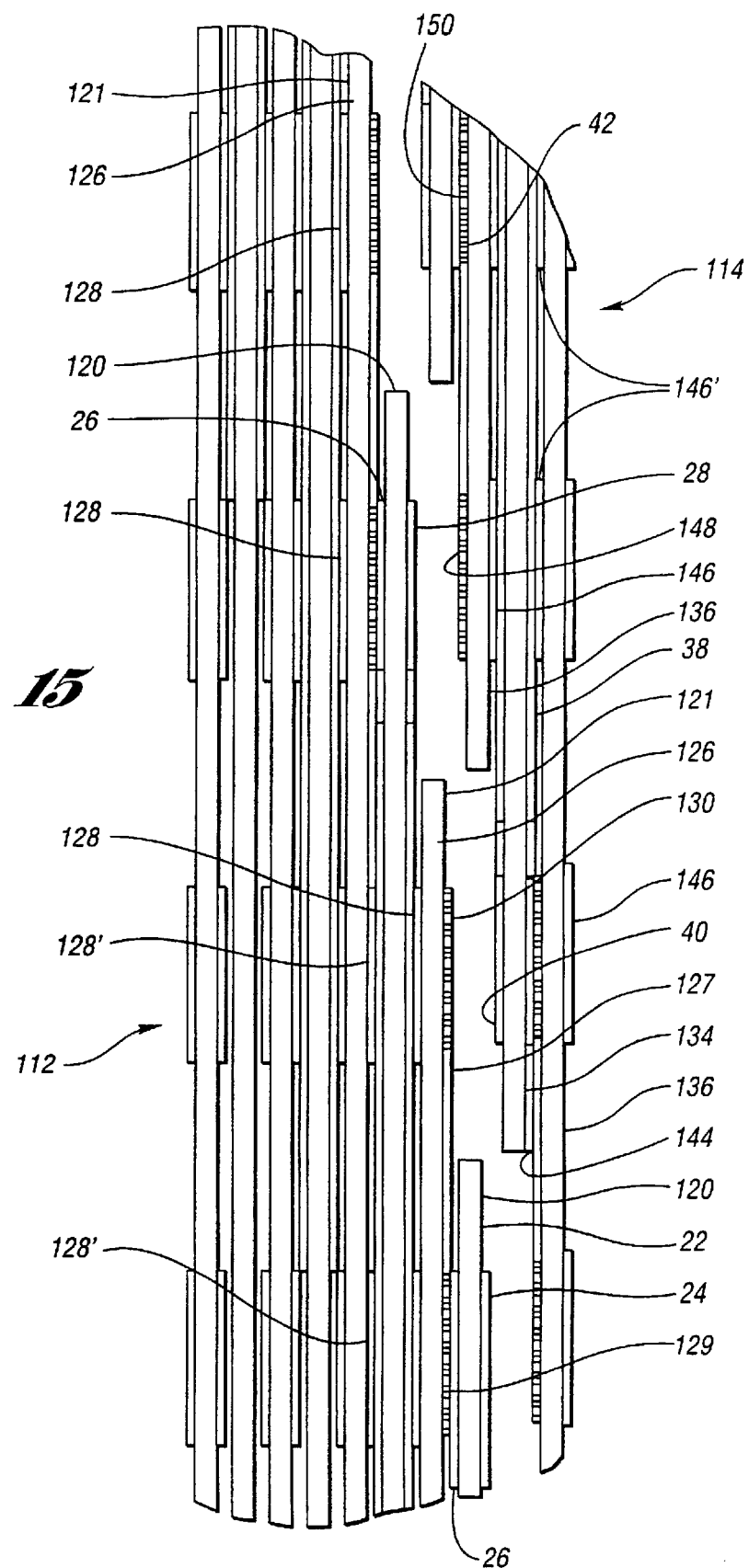
FIG. 15 is an enlarged fragmentary cross-sectional view of the first and second printed circuit boards of the second embodiment of the conductive network positioned adjacent each other.
Figure 16:
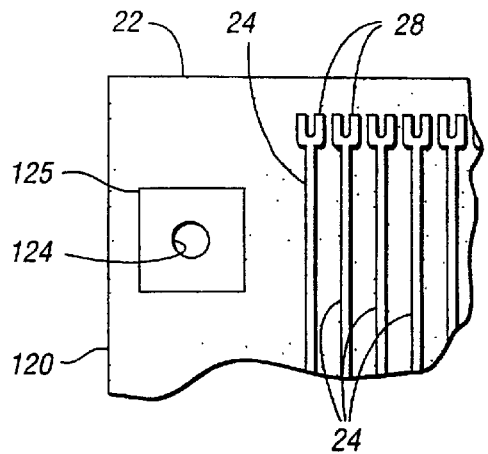
FIG. 16 is a fragmentary plan view of a first signal layer of the first printed circuit board of the second embodiment of the conductive network.

Referring to FIGS. 15 and 16, the first signal layers 120 are preferably similar to the first signal layers 20 described above with respect to the first PCB 12. More specifically, each first signal layer 120 preferably includes a first substrate 22, a plurality of first traces 24 and a first ground plane 26 such as described above with respect to each first signal layer 20. Each first trace 24 has a first contact portion 28.

Each first signal layer 120 also preferably includes one or more first alignment features, such as first holes 124. Furthermore, the first holes 124 are preferably formed in the same manner as the first alignment features of the first PCB 12, so as to provide precise registration of the first holes 124 with respect to the first contact portions 28 of a particular first signal layer 120. More specifically, one or more first guide features or mask features 125 are preferably formed of the same material and at the same time as the first traces 26 by a photo-etching process. The first mask features 125 cooperate to define a template, and a soft laser is used to ablate first substrate material that is not in the shadow of or otherwise covered by the template so as to define the first holes 124. Alternatively, first substrate material may be removed by any suitable ablation process, such as plasma ablation.

Figure 17:
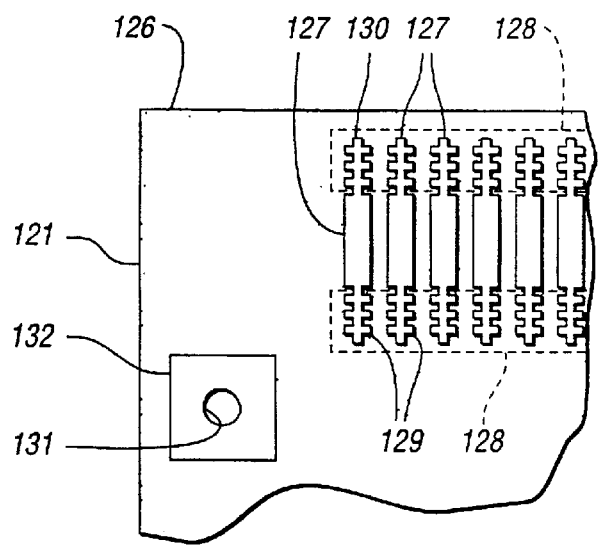
FIG. 17 is a fragmentary plan view of a first bridge layer of the first printed circuit board of the second embodiment of the conductive network.

Referring to FIGS. 15 and 17, each first bridge layer 121 includes a first bridge substrate 126, a plurality of first bridge traces 127 disposed on one side of the first bridge substrate 126, and one or more first fill pads 128 disposed on an opposite side of the first bridge substrate 126. The first bridge traces 127 are preferably similar to the bridge traces 68, and may be formed in a similar manner. Furthermore, each first bridge trace 127 includes first and second bridge contact portions 129 and 130, respectively. The first bridge contact portions 129 of each first bridge layer 121 are engageable with the contact portions of a particular first groung plane 26.

The first fill pads 128 are preferably formed with similar material and in a similar manner as the first bridge traces 127. Each first bridge layer 121 may also be provided with one or more additional first fill pads 128' disposed on the same side of the first bridge substrate as the first bridge traces 127, but spaced away from the first bridge traces 127. The first fill pads 128 and 128' function to concentrate clamping forces on the bridge contact portions 129 and 130, as explained below in greater detail.

Each first bridge layer 121 also preferably includes one or more first bridge layer alignment features, such as first bridge layer holes 131. The first bridge layer holes 131 are preferably formed in the same manner as the first alignment features of the first PCB 12, so as to provide precise registration of the first bridge layer holes 131 with respect to the bridge contact portions 129 and 130. More specifically, one or more first bridge layer guide features or mask features 132 are preferably formed of the same material and at the same time as the first bridge traces 127 by a photo-etching process. The first bridge layer mask features 132 cooperate to define a template, and a soft laser is used to ablate first bridge substrate material that is not in the shadow of or otherwise covered by the template so as to define the first bridge layer holes 131. Alternatively, first bridge substrate material may be removed by any suitable ablation process, such as plasma ablation. Furthermore, the first bridge layer holes 131 are alignable with the first holes 124 so as to define the first staggered step configuration.

Referring to FIGS. 12, 14 and 15, the second PCB 114 has a second main body 133 that includes multiple second signal layers 134 that alternate with second bridge layers 136. A portion 138 of each second signal layer 134 and a portion 139 of each second bridge layer 136 preferably extend beyond the second main body 133 so as to provide access to the second signal layers 134 and second bridge layers 136. The portions 138 and 139 are also preferably flexible and not bonded to each other proximate distal ends of the portions 138 and 139, so that the portions 138 and 139 are independently moveable. Furthermore, the portions 138 and 139 preferably cooperate to define a second staggered step configuration that mates with the first staggered step configuration of the first PCB 112.

Figure 18:
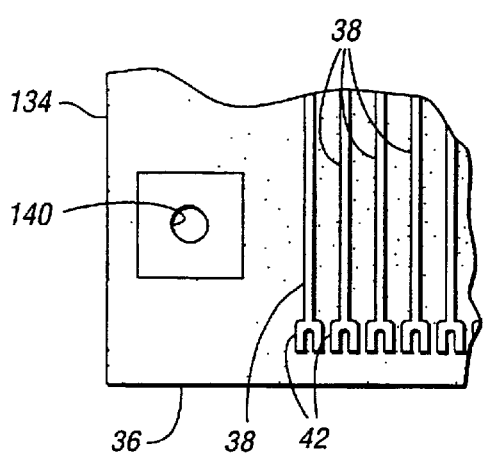
FIG. 18 is a fragmentary plan view of a second signal layer of the second printed circuit board of the second embodiment of the conductive network.

Referring to FIGS. 15 and 18, the second signal layers 134 are similar to the second signal layers 34 described above with respect to the second PCB 14. More specifically, each second signal layer 134 preferably includes a second substrate 36, second traces 38 and a second ground plane 40 such as described above with respect to each second signal layer 34. Each second trace 38 also has a second contact portion 42. Each second ground plane 40 has contact portions that are engageable with the second bridge contact portions 130 of a particular first bridge layer 121.

Each second signal layer 134 also preferably includes one or more second alignment features, such as second holes 140. Furthermore, the second holes 140 are preferably formed in the same manner as the first holes 124 of the first PCB 112, so as to provide precise registration of the second holes 140 with respect to the second contact portions 42 of a particular second signal layer 134.

Figure 19:
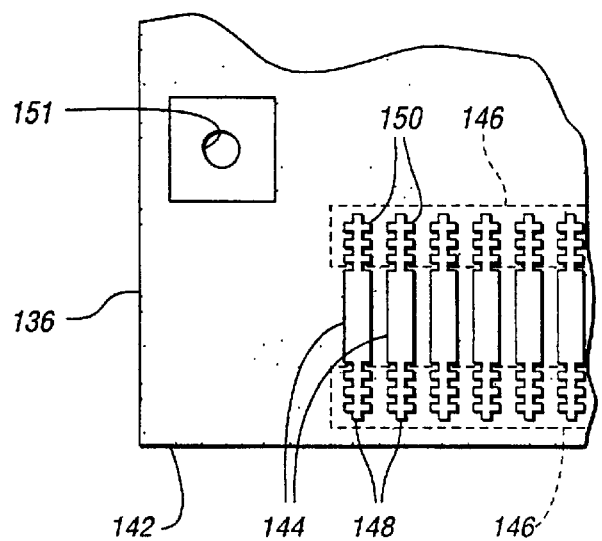
FIG. 19 is a fragmentary plan view of a second bridge layer of the second printed circuit board of the second embodiment of the conductive network.

Referring to FIGS. 15 and 19, each second bridge layer 136 includes a second bridge substrate 142, a plurality of second bridge traces 144 disposed on one side of the second bridge substrate 142, and one or more second fill pads 146 disposed on an opposite side of the second bridge substrate 142. The second bridge traces 144 are preferably similar to the bridge traces 68, and may be formed in a similar manner. Furthermore, each second bridge trace 144 includes first and second bridge contact portions 148 and 150, respectively. The first bridge contact portions 148 of each second bridge layer 136 are engageable with the first contact portions 28 of a particular first signal layer 120. The second bridge contact portions 150 of each second bridge layer 136 are engageable with the second contact portions 42 of a particular second signal layer 134.

The second fill pads 146 are preferably formed with similar material and in a similar manner as the second bridge traces 144. Each second bridge layer 136 may also be provided with one or more additional second fill pads 146' disposed on the same side of the second bridge substrate as the second bridge traces 144, but spaced away from the second bridge traces 144. The second fill pads 146 and 146' function to concentrate clamping forces on the bridge contact portions 148 and 150, as explained below in greater detail.

Each second bridge layer 136 also preferably includes one or more second bridge layer alignment features, such as second bridge layer holes 151. The second bridge layer holes 151 are preferably formed in the same manner as the first bridge layer holes 131 of the first PCB 112, so as to provide precise registration of the second bridge layer holes 151 with respect to the bridge contact portions 148 and 150. Furthermore, the second bridge layer holes 151 are alignable with the second holes 140 so as to define the second staggered step configuration.

The PCB's 112 and 114 are preferably made in a similar manner as described above with respect to the PCB's 12 and 14. More specifically, each signal layer 120 and 134 and each bridge layer 121 and 136 is preferably made by a photo-etching process followed by laser ablation, or other suitable ablation process, such as described above in detail.

The first signal layers 120 and the first bridge layers 121 are then bonded together and cut to a desired size and shape so as to form the first PCB 112 having the first main body 118 and portions 122 and 123 that extend from the first main body 118. Similarly, the second signal layers 134 and the second bridge layers 136 are then bonded together and cut to a desired size and shape so as to form the second PCB 114 having the second main body 133 and portions 138 and 139 that extend from the second main body 133. Alternatively, the signal layers 120 and/or 134 and the bridge layers 121 and/or 136 may be cut or otherwise shaped prior to bonding the signal layers 120 and/or 134 and the bridge layers 121 and/or 136 together.

Referring to FIGS. 12–14, the connector assembly 116 is used to align and force together the first and second staggered step configurations of the first and second PCB's 112 and 114, respectively, so as to electrically join together the first and second traces 24 and 38, as well as the first and second ground planes 26 and 40. The connector assembly 116 includes first and second fixtures 152 and 154, respectively, and one or more clamping devices such as fasteners 156. The first fixture 152 is connected to the first PCB 112 such that the portions 122 and 123 of the first signal layers 120 and the first bridge layers 121, respectively, cooperate to define the first staggered step configuration. For example, the first fixture 152 may include one or more first alignment members, such as first pins 158, that extend through the first holes 124 of the first signal layers 120 and the first bridge layer holes 131 of the first bridge layers 121. Preferably, the first fixture 152 includes two first pins 158, each first signal layer 120 includes two first holes 124, and each first bridge layer 121 includes two first bridge layer holes 131. Advantageously, because the portions 122 and 123 are flexible and moveable with respect to each other, the portions 122 and 123 may be easily positioned so as to define the first staggered step configuration.

The second fixture 154 is connected to the second PCB 114 such that the portions 138 and 139 of the second signal layers 134 and the second bridge layers 136, respectively, cooperate to define the second staggered step configuration. For example, the second fixture 154 may include one or more second alignment members such as second pins 160 that extend through the second holes 140 and the second bridge layer holes 151. Preferably, the second fixture 154 includes two second pins 160, each second signal layer 134 includes two second holes 140, and each second bridge layer 136 includes two second bridge layer holes 151. Advantageously, because the portions 138 and 139 are flexible and moveable with respect to each other, the portions 138 and 139 may be easily positioned so as to define the second staggered step configuration.

To electrically join the PCB's 112 and 114, the fixtures 152 and 154 may first be snapped together or otherwise moved toward each other. Preferably, each fixture 152 and 154 includes a flange portion 162 that engages the other fixture 152 or 154 so as to properly align the fixtures 152 and 154 when the fires 152 and 154 are moved together. The fasteners 156 are then inserted into corresponding apertures in the fixtures 152 and 154, and the fasteners 156 are tightened so as to apply a clamping force on the portions 122, 123, 138 and 139 of the PCB's 112 and 114. Referring to FIG. 15, when the clamping force is applied, the first bridge traces 127 of the first bridge layers 121 electrically join the first and second ground planes 26 and 40, respectively, of the first and second signal layers 120 and 134, respectively. Furthermore, the second bridge traces 144 of the second bridge layers 136 electrically join the first and second traces 24 and 38, respectively, of the first and second signal layers 120 and 134, respectively.

Advantageously, the fill pads 128, 128', 146 and 146' concentrate the clamping force at the contact portions 28, 42, 129, 130, 148 and 150 so as to improve contact between the PCB's 112 and 114. Substrate material may also be removed from the signal layers 120 and 134 and/or the bridge layers 121 and 136, such as described above with respect to the network 10, so as to improve flexibility of one or more of the contact portions 28, 42, 129, 130, 148 and 150.

It is to be understood that the first and second bridge layers 121 and 136, respectively, may also function as signal layers within the first and second main bodies 118 and 133, respectively, of the first and second PCB's 112 and 114, respectively. For example, each bridge layer 121 and 136 may be provided with multiple conductive traces and/or a ground plane.

Figure 20:
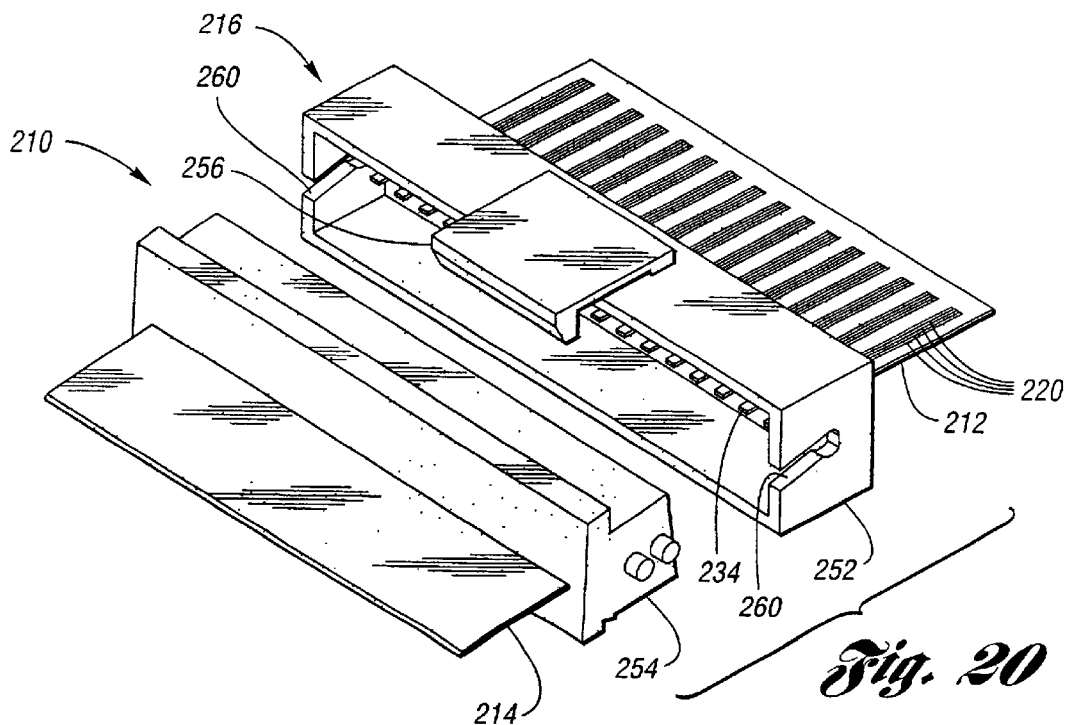
FIG. 20 is a perspective view of a third embodiment of the conductive network according to the invention including first and second printed circuit boards and a connector assembly, wherein the connector assembly includes first and second fixtures.
Figure 21:
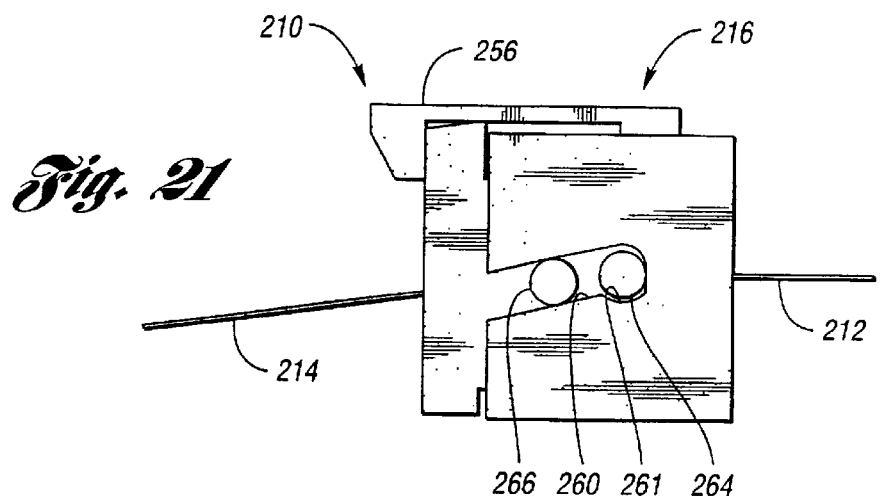
FIG. 21 is a side view of the third embodiment of the conductive network.
Figure 22:
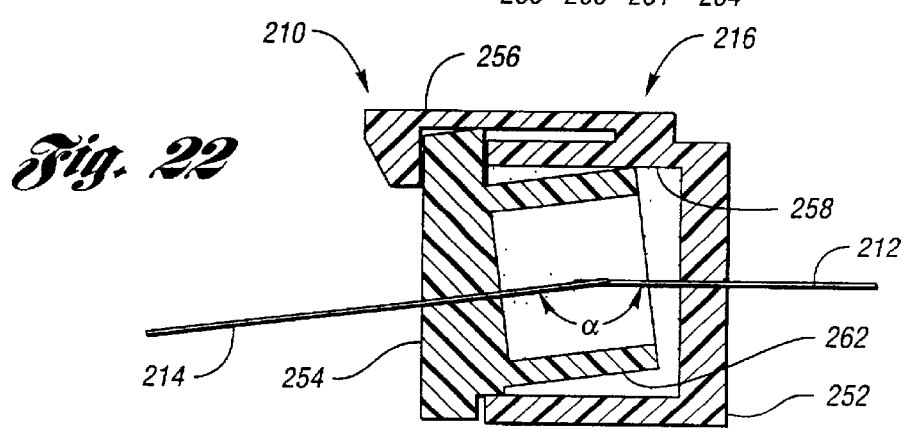
FIG. 22 is a cross-sectional view of the third embodiment of the conductive network.
Figure 23:
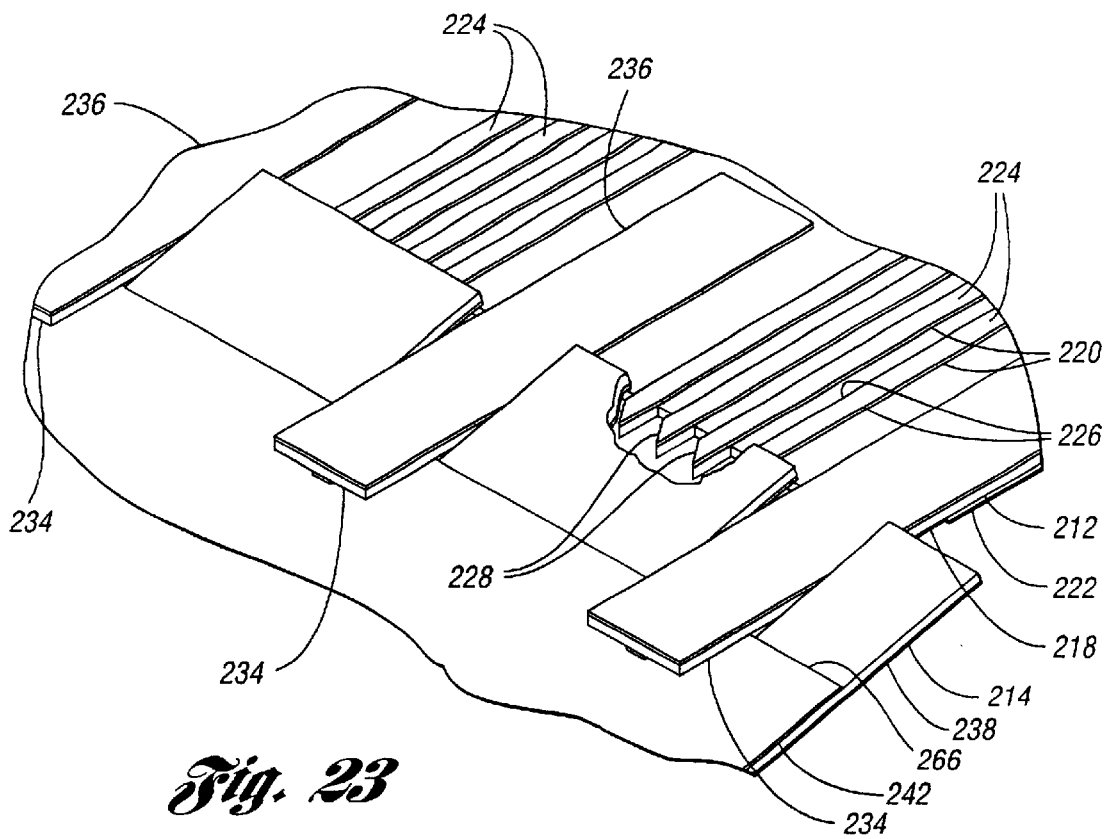
FIG. 23 is a perspective view of the printed circuit boards of the third embodiment of the conductive network with the first and second fixtures removed.
Figure 24:
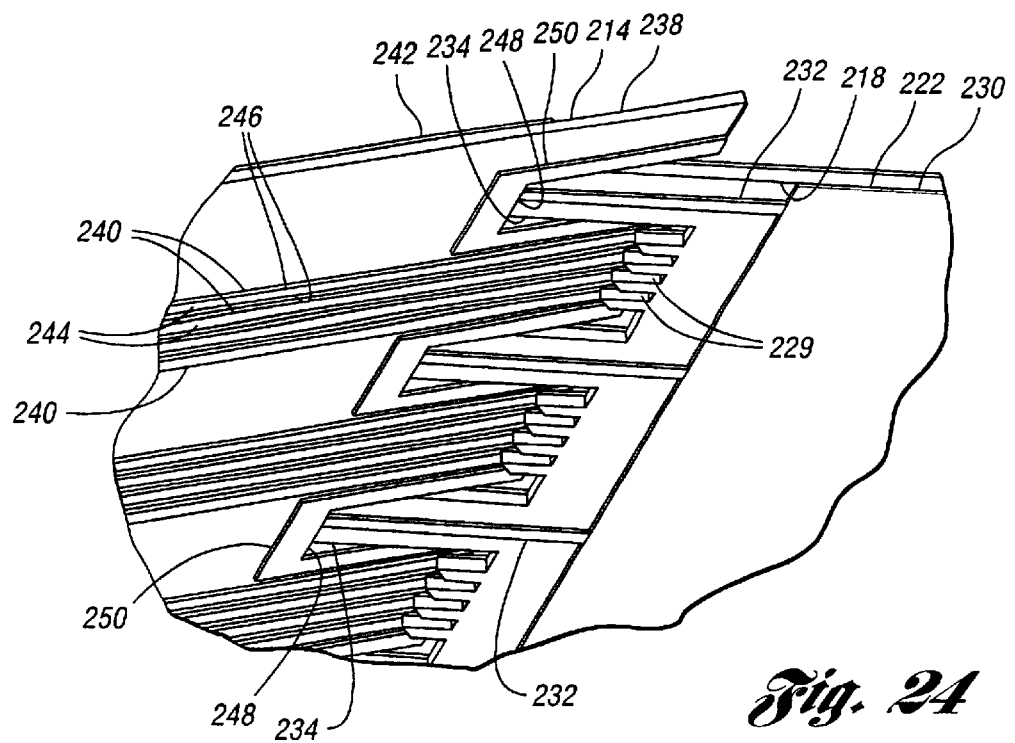
FIG. 24 is a bottom perspective view of the printed circuit boards of FIG. 23.
Figure 25:
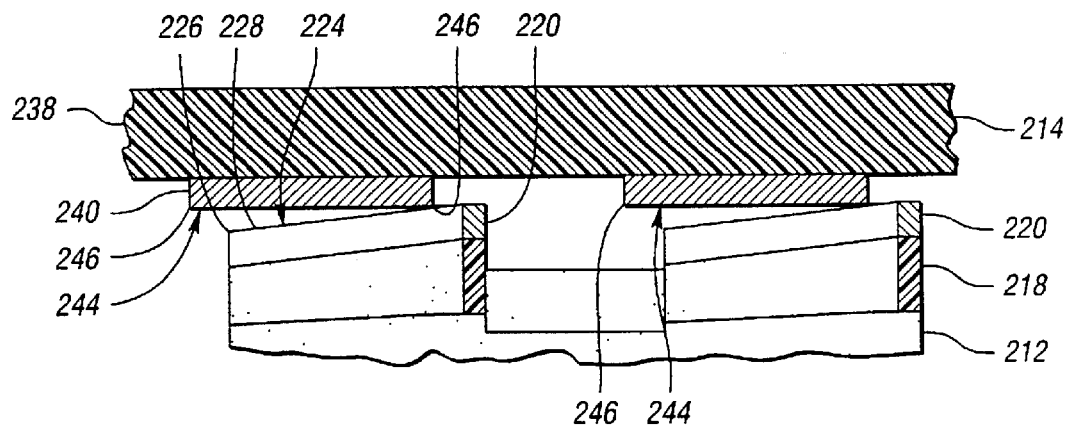
FIG. 25 is an end cross-sectional view of the printed circuit boards of FIG. 23.

FIGS. 20–22 show a third embodiment 210 of the conductive network that includes first and second conductive devices, such as first and second printed circuit boards (PCB's) 212 and 214, respectively, and a connector assembly 216 for connecting together the PCB's 212 and 214. Referring to FIGS. 23–25, the first PCB 212 includes a first substrate 218, a plurality of first traces 220 disposed on one side of the first substrate 218, and a first ground plane 222 disposed on an opposite side of the first substrate 218. Each first trace 220 includes a generally planar first surface 224 spaced away from the first substrate 218. Each first surface 224 defines a plurality of first edges such as side edges 226 and end edge 228. Preferably, but not necessarily, each end edge 228 is slanted as shown in FIG. 23.

First substrate material may also be removed between adjacent first traces 220, in a similar manner as described above, so as to form a plurality of first apertures such as first gaps or notches 229. With such a configuration, each first trace 220 may be independently displaced with respect to the other first traces 220. Alternatively, first substrate material may be removed between select first traces 220, or the first substrate 218 may be left intact.

The first ground plane 222 includes a main portion 230 and a plurality of ground extensions 232 extending from the main portion 230. The main portion 230 may have any suitable configuration such as a solid plane, as shown in FIG. 24, or cross-hatched configuration as is known in the art.

The first PCB 212 also includes one or more first alignment features such as tabs 234. The tabs 234 are used to align the first traces 224 with respect to the second PCB 214, as explained below in greater detail. The tabs 234 also provide support for the ground extensions 232.

The tabs 234 are preferably formed in the same manner as the first alignment features of the first PCB 12, so as to provide precise registration of the tabs 234 with respect to the first traces 224. More specifically, each tab 234 preferably has a backing layer 236 that is formed in the same manner and at the same time as each first trace 224. The backing layers 236 are preferably used as guide features or mask features for forming the tabs 234 by laser ablation, or other suitable ablation process, such as described above in detail. Advantageously, the backing layers 236 also increase stiffness of the tabs 234.

The second PCB 214 includes a second substrate 238, a plurality of second traces 240 disposed on one side of the second substrate 238, and a second ground plane 242 disposed on an opposite side of the second substrate 238. Each second trace 240 includes a generally planar second surface 244 spaced away from the second substrate 238. Each second surface 244 defines a plurality of second edges such as side edges 246.

The second PCB 214 also includes one or more second alignment features such as slots 248. The slots 248 are configured to receive the tabs 234 so as to align the traces 220 and 240 in a desired orientation. Preferably, as shown in FIG. 25, the traces 220 and 240 are aligned such that the first traces 220 are laterally offset with respect to the second traces 240.

The slots 248 are preferably formed in the same manner as the second alignment features of the second PCB 14, so as to provide precise registration of the slots 248 with respect to the second traces 240. More specifically, U-shaped guide features or mask features 250 are preferably formed in the same manner and at the same time as the second traces 240. The mask features 250 are then used as a cutting template for forming the slots 248 by laser ablation, or other suitable ablation process, such as described above in detail.

The PCB's 212 and 214 are preferably made in a similar manner as described above with respect to the PCB's 12 and 14. More specifically, each PCB 212 and 214 is preferably made by a photo-etching process followed by laser ablation, or other suitable ablation process, such as described above in detail.

Referring to FIGS. 20–22, the connector assembly 216 is used to electrically join together the first and second traces 220 and 240, respectively, as well as the first and second ground planes 222 and 242, respectively. The connector assembly 216 includes first and second connector portions or fixtures 252 and 254, respectively, and a clamping device 256. The first and second fixtures 252 and 254 are engageable with each other so as to join the PCB's 212 and 214 at an angle with respect to each other, as shown in FIG. 22.

The first fixture 252 is connected to the first PCB 212 in any suitable manner, and includes a cavity 258 for receiving the second fixture 254. The first fixture 252 further includes one or more guide slots 260, and each guide slot 260 preferably includes an enlarged portion 261. The first fixture 252 also includes the clamping device 256, which is preferably a flexible latch as shown in FIG. 20.

Alternatively, the clamping device 256 may be provided as part of the second fixture 254, or separate from either fixture 252 or 254. Furthermore, the clamping device 256 may be any suitable device such as one or more screws or bolts (not shown).

The second fixture 254 is connected to the second PCB 214 in any suitable manner, and includes a projection 262 that is insertable into the cavity 258. The second fixture 254 further preferably includes first and second guide pegs 264 and 266, respectively, on both sides of the second fire 254 (only one pair of guide pegs 264 and 266 is shown in FIG. 21).

To electrically join the PCB's 212 and 214, the second fixture 254 is inserted into the first fixture 252 such that the guide pegs 264 and 266 are inserted into the guide slots 260. As the fixtures 252 and 254 are moved toward each other, the tabs 234 mesh with the slots 248 so as to properly align the first traces 220 with the second traces 240. When the first guide pegs 264 reach the enlarged portions 261 of the guide slots 260, the second fixture 254 rotates slightly clockwise, with respect to FIGS. 21 and 22. The second fixture 254 is then clamped against the first fixture 252 with the clamping device 256.

Referring to FIG. 22, because the second fixture 254 is able to rotate slightly with respect to the first fixture 252, the angle a between the PCB's 212 and 214 increases slightly. This action produces a clamping or contact force which forces the traces 220 and 240 against each other. More specifically, referring to FIGS. 23–25, the end edge 228 of each first trace 220 is forced against a side edge 246 of a particular second trace 240 so as to define or otherwise form an area of contact, which in this case is a point contact. Because the traces 220 and 240 are forced together at an angle, a portion of each first surface 224 proximate a respective point contact is non-parallel with a portion of a respective second surface 244 proximate the respective point contact.

Advantageously, because each pair of mating edges 228 and 246 preferably forms a point contact, the contact force may be concentrated over a relatively small area. As a result, the traces 220 and 240 may be sufficiently deformed at the point contacts so as to establish reliable connections between the traces 220 and 240.

Furthermore, because the edges 228 and 246 are precisely defined by the photo-etching process, the edges 228 and 246 are sharp. Preferably the radius of each edge 228 and 246 is less than 0.1 mm. Thus, when the edges 228 and 246 are forced together, the edges 228 and 246 are able to break through oxides and displace any insulating debris that may have collected on the traces 220 and 240.

Because the first traces 220 are preferably independently moveable as described above, the conductive network 210 is able to overcome any non-coplanarity of the first traces 220 and/or second traces 240. Alternatively or supplementally, the second PCB 214 may be provided with apertures, such as notches, between adjacent second traces 240, so that each second trace 240 is independently moveable.

It should be noted that if the end edges 228 of the first traces 220 are not slanted, when the end edges 228 are forced against the second traces 240, each end edge 228 will form an area of contact, such as a line of contact, with a particular second surface 244. Again, however, a portion of each first surface 224 proximate a respective line of contact will be non-parallel with a portion of a respective second surface 244 proximate the respective line of contact.

The contact force also forces together the ground extensions 232 and the second ground plane 242. Each ground extension 232 forms an area of contact, such as a line of contact, with an end edge 266 of the second ground plane 242. Alternatively, each ground extension 232 may be provided with a slanted end edge that precisely mates with an end edge 266 of the second ground plane 242 so as to form a point contact.

As mentioned above, the tabs 234 preferably include backing layers 236 to increase stiffness of the tabs 234, which thereby increases the contact force. Similarly, the second ground plane 242 may be extended between the slots 248 to increase the stiffness of the second PCB 214 and thereby increase the contact force.

Figure 26:
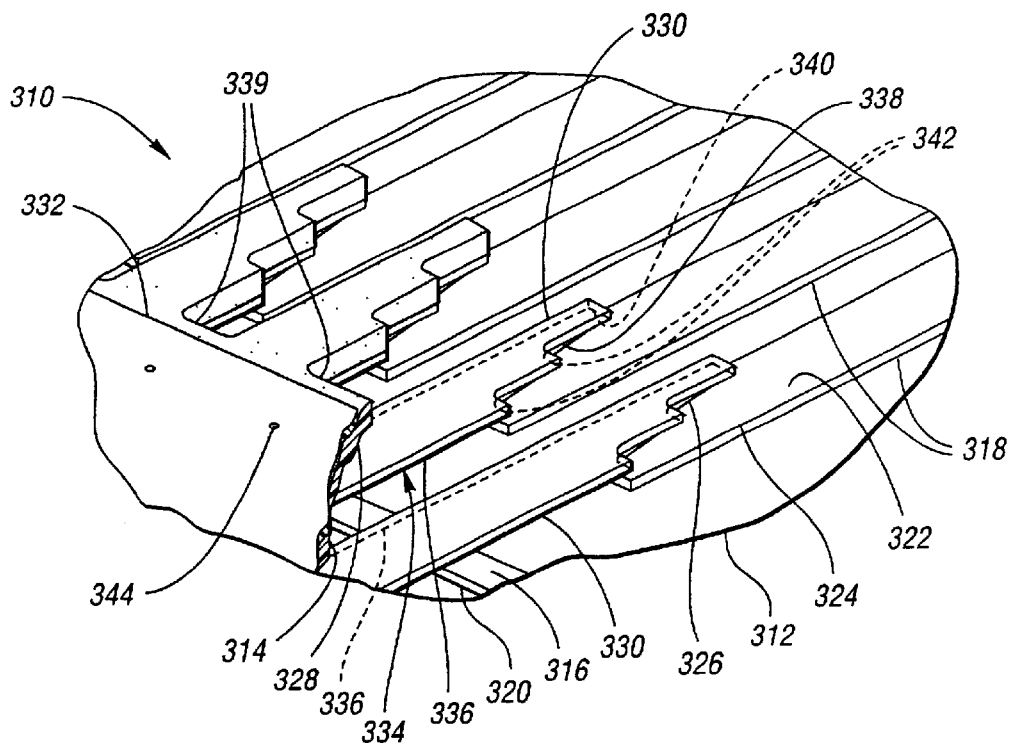
FIG. 26 is a fragmentary perspective view of a fourth embodiment of the conductive network according to the invention.

It should be noted that there are various other alternatives for joining an edge of one trace to a portion of another trace so as to form an area of contact such as a line of contact or a point contact. For example, FIG. 26 shows a fourth embodiment 310 of the conductive network according to the invention that includes first and second conductive devices, such as first and second PCB's 312 and 314, respectively. The first PCB 312 includes a first substrate 316, a plurality of first traces 318 disposed on one side of the first substrate 316, and a first ground plane 320 disposed on an opposite side of the first substrate 316. Each first trace 318 includes a generally planar first surface 322 spaced away from the first substrate 316. Each first surface 322 defines a plurality of first edges such as first side edges 324 and first end edges 326. Similar to the first PCB 212 described above, each first end edge 326 is preferably slanted.

The second PCB 314 includes a second substrate 328, a plurality of second traces 330 disposed on one side of the second substrate 328, and a second ground plane 332 disposed on an opposite side of the second substrate 328. Each second trace 330 includes a generally planar second surface 334 spaced away from the second substrate 328. Each second surface 334 defines a plurality of second edges such as second side edges 336 and second end edges 338. Preferably, but not necessarily, each second end edge 338 may be formed with a staggered step configuration as shown in FIG. 26. For clarity purposes, the second substrate 328 has been broken away in FIG. 26 so as to reveal ends of two of the second traces 330.

Furthermore, substrate material may also be removed between adjacent second traces 330 so as to form a plurality of apertures such as gaps or notches 339. With such a configuration, each second trace 330 may be independently displaced with respect to the other second traces 330. Alternatively, substrate material may be removed between select second traces 330.

To electrically join the PCB's 312 and 314, the PCB's 312 and 314 are positioned adjacent each other and are forced together such as with any suitable clamping device. With the configuration of the PCB's 312 and 314 described above, it is not necessary that the PCB's 312 and 314 be joined at an angle. Instead, because of the notches 339, each second trace 330 may twist or otherwise rotate with respect to a particular first trace 318 when the PCB's 312 and 314 are forced together. As a result, each first end edge 326 will mate with a second surface 334 and/or a second end edge 338 of a particular second trace 330. For example, if each second trace 330 does not substantially flex vertically as the PCB's 312 and 314 are forced together, then a distal portion 340 of each second end edge 338 may mate with a particular first end edge 326 so as to define or form a point contact. If, however, each second trace 330 does flex vertically as the PCB's 312 and 314 are forced together, then each first end edge 326 may mate with a second surface 334 of a particular second trace 330 so as to form a line of contact. In this case, at least one of the intermediate portions 342 of each second end edge 338 will preferably form a point contact with a respective first end edge 326.

Because the second traces 330 are able to twist with respect to the first traces 318, each second surface 334 proximate a respective end of a respective second trace 330 will be non-parallel with a respective first surface 322 of a respective first trace 318. Thus, no matter what type of area of contact is formed between a pair of mating traces 318 and 330, a portion of each first surface 322 proximate a respective area of contact will preferably be non-parallel with a portion of a respective second surface 334 proximate the respective area of contact.

Alternatively or supplementally, the first PCB 312 may be provided with apertures such as gaps or notches between adjacent first traces 318 so that the each first trace 318 may twist or otherwise rotate. In any case, the first traces 318 are preferably laterally offset with respect to the second traces 330 to facilitate twisting of the traces 318 and/or 330.

It should be noted that with such a configuration as shown in FIG. 24, the ground planes 320 and 332 may be connected together in any suitable manner. For example, the ground planes 320 and 332 may be connected together with micro-vias 344. Furthermore, the micro-vias 344 may be formed by laser ablation, or other suitable ablation process, as is known in the art.

As another example, an area of contact between a pair of traces may be formed by angling the traces horizontally and vertically with respect to each other, such that a side edge of one trace will intersect a surface (so as to form a line of contact) or a side edge (so as to form a point contact) of the other trace.

In general terms, an area of contact between an edge of one trace and a surface or edge of another trace may be formed by establishing two angles between the traces to be joined, wherein both angles are preferably less than 180 degrees. For example, as described above, a first angle may be established between two traces by configuring an end edge of one trace so that the end edge is slanted with respect to a side edge of the other trace. Alternatively, the first angle may be established between the traces by configuring the end edge of the one trace so that it is perpendicular with respect to the side edge of the other trace. A second angle may be established between the two traces by tilting the one trace with respect to the other trace so that the end edge of the one trace contacts the side edge or a surface of the other trace. Alternatively, the second angle may be established between the traces by rotating or twisting one trace with respect to the other trace.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. For example, although for each embodiment described above, the conductive devices are shown as printed circuit boards, each conductive device may be any suitable transmission line structure provided with or without a ground plane.

What is claimed is:

1. A method of forming a conductive device, the method comprising:
    forming a first and second conductive layers on first and second sides, respectively, of a substrate;
    etching the first conductive layer to form a plurality of conductive traces;
    etching the first conductive layer to form at least one mask feature;
    etching the second conductive layer to define a ground plane; and
    removing substrate material that is not covered by the at least one mask feature so as to form at least on& mechanical alignment feature, wherein the at least one alignment feature includes at least one side edge;
    wherein the conductive traces and the ground plane form part of the conductive device.

2. The method of claim 1 wherein the etching steps performed on the first conductive layer are performed simultaneously.

3. The method of claim 1 wherein the removing step includes removing the substrate material with a laser.

4. The method of claim 1 wherein the removing step includes removing the substrate material so as to form at least one aperture.

5. The method of claim 1 wherein the removing step includes removing the substrate material so as to form at least one tab.

6. The method of claim 1 wherein the removing step includes removing the substrate material so as to form at least one slot.

7. A method of forming a printed circuit board, the method comprising:
    forming a first and second conductive layers on first and second opposite sides, respectively, of a substrate;
    etching the first conductive layer to form multiple spaced apart conductive traces, each trace having a contact portion,
    etching the first conductive layer to form multiple mask features that cooperate to define a template;
    etching the second conductive layer to define a ground plane that includes multiple ground contact portions; and
    ablating with a laser substrate material that is not covered by the template so as to form a plurality of mechanical alignment features, wherein the mechanical alignment features include multiple apertures and multiple side edges;
    wherein the conductive traces and the ground plane form part of the printed circuit board.

8. The method of claim 7 wherein the etching steps are performed simultaneously.

9. The method of claim 1 wherein the at least one mask feature includes at least one U-shaped mask feature.

10. The method of claim 1 wherein the at least one mechanical alignment feature includes at least one rectangular tab.

11. The method of claim 1 wherein the at least one mechanical alignment feature includes at least one rectangular slot.

12. The method of claim 7, wherein the ablating step comprises positioning a beam of the laser normal to the surface of the substrate having the conductive traces and mask features formed thereon.

13. The method of claim 7 wherein the multiple mask features include multiple U-shaped mask features.

14. The method of claim 7 wherein the plurality of mechanical alignment features includes multiple tabs.

15. The method of claim 7 wherein the plurality of mechanical alignment features includes multiple rectangular tabs.

16. The method of claim 7 wherein the plurality of mechanical alignment features includes multiple rectangular slots.

17. The method of claim 7 wherein the etching steps performed on the first conductive layer are performed simultaneously such that the method provides precise registration of the mechanical alignment features with the conductive traces.

18. A method of forming a conductive device, the method comprising:
    forming a conductive layer on a substrate;
    etching the conductive layer to form a plurality of conductive traces;
    etching the conductive layer to form at least one mask feature; and
    removing substrate material that is not covered by the at least one mask feature so as to form at least one mechanical alignment feature, wherein the at least one alignment feature includes at least one tab.

19. The method of claim 18 wherein the at least one tab includes at least one rectangular tab.

* * * * *